(12) United States Patent
Sakiyama et al.

(10) Patent No.: US 9,824,941 B2
(45) Date of Patent: Nov. 21, 2017

(54) SYSTEMS AND METHODS FOR DETECTION OF PLASMA INSTABILITY BY ELECTRICAL MEASUREMENT

(71) Applicant: Lam Research Corporation, Fremont, CA (US)

(72) Inventors: Yukinori Sakiyama, West Linn, OR (US); Ishtak Karim, Portland, OR (US); Yaswanth Rangineni, Beaverton, OR (US); Adrien LaVoie, Newberg, OR (US); Ramesh Chandrasekharan, Portland, OR (US); Edward Augustyniak, Tualatin, OR (US); Douglas Keil, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/074,853

(22) Filed: Mar. 18, 2016

(65) Prior Publication Data

US 2017/0141000 A1 May 18, 2017

Related U.S. Application Data

(60) Provisional application No. 62/256,682, filed on Nov. 17, 2015.

(51) Int. Cl.
*H01L 21/00* (2006.01)
*H01L 21/66* (2006.01)
(Continued)

(52) U.S. Cl.
CPC ........ *H01L 22/20* (2013.01); *H01J 37/32082* (2013.01); *H01J 37/32715* (2013.01);
(Continued)

(58) Field of Classification Search
CPC ................ H01L 22/20; H01J 37/32082; H01J 37/32715
(Continued)

(56) References Cited

U.S. PATENT DOCUMENTS

2003/0015965 A1* 1/2003 Godyak ............ H01J 37/32009
315/111.21
2005/0134186 A1* 6/2005 Brouk ............... H01J 37/32935
315/111.21

(Continued)

*Primary Examiner* — Caleb Henry
(74) *Attorney, Agent, or Firm* — Martine Penilla Group, LLP

(57) ABSTRACT

A wafer is positioned on a wafer support apparatus beneath an electrode such that a plasma generation region exists between the wafer and the electrode. Radiofrequency power is supplied to the electrode to generate a plasma within the plasma generation region during multiple sequential plasma processing cycles of a plasma processing operation. At least one electrical sensor connected to the electrode measures a radiofrequency parameter on the electrode during each of the multiple sequential plasma processing cycles. A value of the radiofrequency parameter as measured on the electrode is determined for each of the multiple sequential plasma processing cycles. A determination is made as to whether or not any indicatory trend or change exists in the values of the radiofrequency parameter as measured on the electrode over the multiple sequential plasma processing cycles, where the indicatory trend or change indicates formation of a plasma instability during the plasma processing operation.

21 Claims, 19 Drawing Sheets

(51) Int. Cl.
  *H01L 21/67*    (2006.01)
  *H01L 21/3065*  (2006.01)
  *H01J 37/32*    (2006.01)

(52) U.S. Cl.
  CPC .... *H01L 21/3065* (2013.01); *H01L 21/67069* (2013.01); *H01J 2237/334* (2013.01)

(58) Field of Classification Search
  USPC .......................................................... 438/10
  See application file for complete search history.

(56) References Cited

U.S. PATENT DOCUMENTS

| | | | |
|---|---|---|---|
| 2010/0270141 A1* | 10/2010 | Carter | H01J 37/32935 204/164 |
| 2011/0236594 A1* | 9/2011 | Haverkamp | C23C 16/24 427/553 |
| 2014/0232374 A1* | 8/2014 | Leray | H01J 37/32082 324/96 |
| 2014/0262789 A1* | 9/2014 | Shannon | C02F 1/46 204/554 |
| 2016/0111258 A1* | 4/2016 | Taskar | H01J 37/32449 156/345.24 |

\* cited by examiner (View A-A)

(View A-A)

SYSTEMS AND METHODS FOR DETECTION OF PLASMA INSTABILITY BY ELECTRICAL MEASUREMENT

CLAIM OF PRIORITY

This application claims priority under 35 U.S.C. 119(e) to U.S. Provisional Patent Application No. 62/256,682, filed Nov. 17, 2015, the disclosure of which is incorporated herein by reference in its entirety for all purposes.

BACKGROUND

1. Field of the Invention

The present invention relates to semiconductor device fabrication.

2. Description of the Related Art

Many modern semiconductor chip fabrication processes include generation of a plasma from which ions and/or radical constituents are derived for use in either directly or indirectly affecting a change on a surface of a wafer exposed to the plasma. For example, various plasma-based processes can be used to etch material from a wafer surface, deposit material onto a wafer surface, or modify a material already present on a wafer surface. The plasma is often generated by applying radiofrequency (RF) power to a process gas in a controlled environment, such that the process gas becomes energized and transforms into the desired plasma. The characteristics of the plasma are affected by many process parameters including, but not limited to, material composition of the process gas, flow rate of the process gas, geometric features of the plasma generation region and surrounding structures, temperatures of the process gas and surrounding materials, frequency and magnitude of the RF power applied, and bias voltage applied to attract charged constituents of the plasma toward the wafer, among others.

However, in some plasma processes, the above-mentioned process parameters may not provide for adequate control of all plasma characteristics and behavior. In particular, in some plasma processes, an instability referred to as a "plasmoid" may occur within the plasma, where the plasmoid is characterized by a small area of higher density plasma surrounded by larger volumes of normal density plasma. The formation of plasmoids can lead to non-uniformity in the processing results on the wafer. Therefore, it is of interest to detect plasmoid formation, so as to enable mitigating and/or corrective action. It is within this context that the present invention arises.

SUMMARY

In an example embodiment, a method is disclosed for plasma processing of a wafer. The method includes positioning a wafer on a wafer support apparatus. The wafer support apparatus is positioned beneath an electrode such that a plasma generation region exists between the wafer and the electrode. The method also includes supplying radiofrequency power to the electrode to generate a plasma within the plasma generation region during multiple sequential plasma processing cycles of a plasma processing operation. The method also includes operating at least one electrical sensor connected to the electrode to measure a radiofrequency parameter on the electrode during each of the multiple sequential plasma processing cycles. The method also includes determining a value of the radiofrequency parameter as measured on the electrode for each of the multiple sequential plasma processing cycles. The method also includes determining whether or not an indicatory trend or change exists in the values of the radiofrequency parameter as measured on the electrode over the multiple sequential plasma processing cycles, where the indicatory trend or change indicates formation of a plasma instability during the plasma processing operation.

In an example embodiment, a system for plasma processing of a wafer is disclosed. The system includes a wafer support apparatus configured to support a wafer during a plasma processing operation. The system also includes an electrode positioned above the wafer support apparatus so as to form a plasma generation region between the electrode and the wafer support apparatus. The system also includes a radiofrequency power supply connected to deliver radiofrequency power to the electrode. The system also includes at least one electrical sensor connected to the electrode and configured to measure one or more of radiofrequency voltage on the electrode, radiofrequency current on the electrode, radiofrequency signal frequency on the electrode, radiofrequency impedance on the electrode, radiofrequency phase angle on the electrode, and radiofrequency power on the electrode. The system also includes an electrical signal processing unit connected to receive measurement data from the at least one electrical sensor during the plasma processing operation. The electrical signal processing unit is configured to determine values of one or more radiofrequency parameters present on the electrode based on the received measurement data from the at least one electrical sensor. The one or more radiofrequency parameters include a radiofrequency voltage, a radiofrequency current, a radiofrequency signal frequency, a radiofrequency impedance, a radiofrequency phase angle, and a radiofrequency power. The electrical signal processing unit is also configured to determine whether or not an indicatory trend or change exists in one or more of the radiofrequency parameters, where the indicatory trend or change indicates formation of a plasma instability during the plasma processing operation.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Deposition of films can be implemented in a plasma enhanced chemical vapor deposition (PECVD) system. The PECVD system may take many different forms. The PECVD system includes one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). A wafer undergoing deposition may be transferred from one station to another within a reactor chamber during the process. Of course, the film deposition may occur entirely at a single station or any fraction of the film may be deposited at any number of stations. While in process, each wafer is held in place by a pedestal, wafer chuck and/or other wafer holding apparatus. For certain operations, the apparatus may include a heater such as a heating plate to heat the wafer.

In an example embodiment, the term wafer as used herein refers to a semiconductor wafer. Also, in various embodiments, the wafer as referred to herein may vary in form, shape, and/or size. For example, in some embodiments, the wafer as referred to herein may correspond to a 200 mm (millimeters) semiconductor wafer, a 300 mm semiconductor wafer, or a 450 mm semiconductor wafer. Also, in some embodiments, the wafer as referred to herein may correspond to a non-circular substrate, such as a rectangular substrate for a flat panel display, or the like, among other shapes.

Figure 1A:
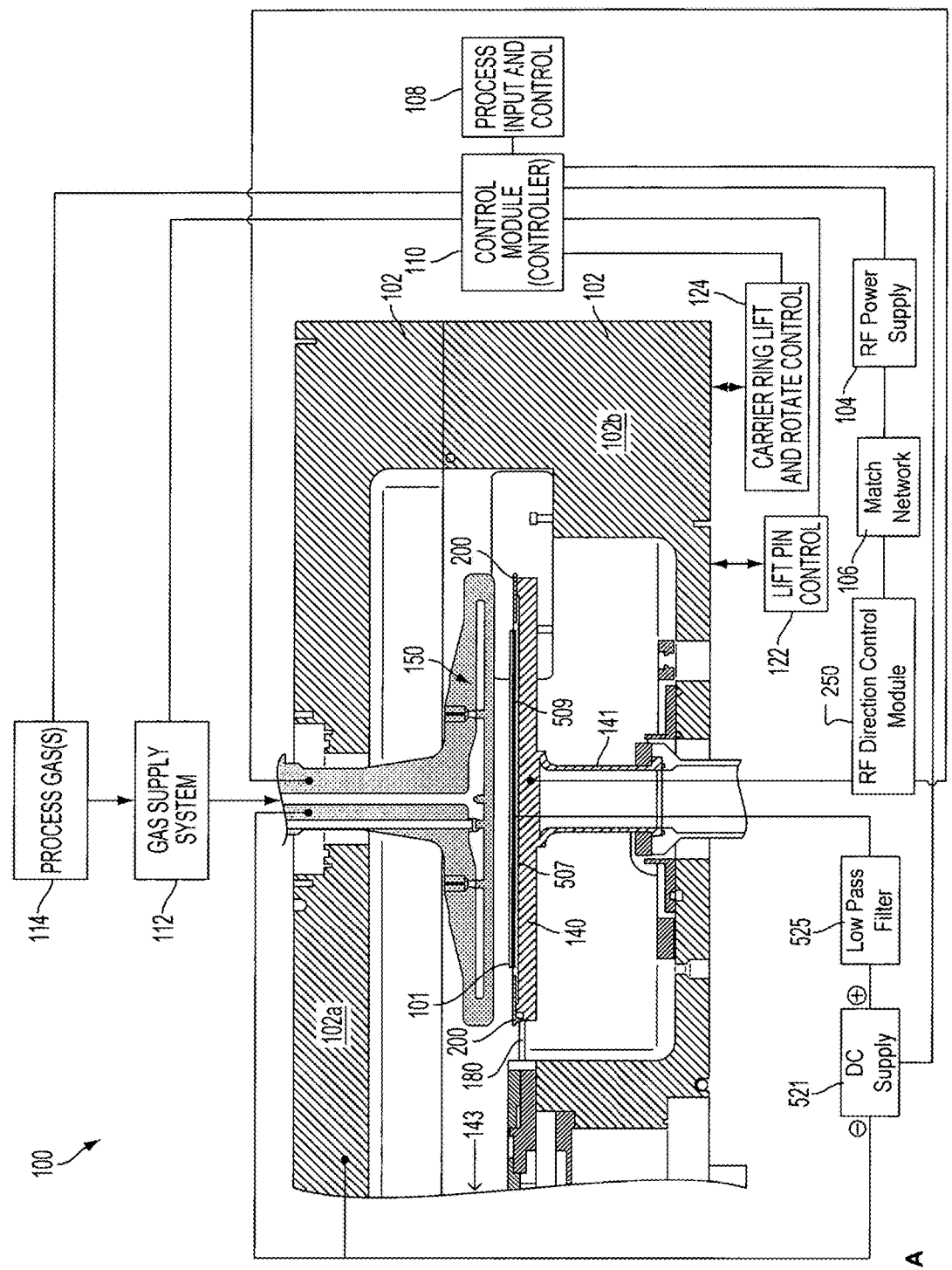
FIG. 1A shows a wafer processing system, in accordance with some embodiments of the present invention.

FIG. 1A illustrates a wafer processing system 100, which is used to process a wafer 101, in accordance with some embodiments of the present invention. The system includes a chamber 102 having a lower chamber portion 102b and an upper chamber portion 102a. A center column 141 is configured to support a pedestal 140 formed of an electrically conductive material. The electrically conductive pedestal 140 is connected to receive RF signals from an RF power supply 104 by way of a match network 106, depending on a setting of an RF direction control module 250. Also, in the wafer processing system 100 of FIG. 1A, a showerhead electrode 150 is configured and connected to receive RF signals from the RF power supply 104 by way of the match network 106, depending on the setting of the RF direction control module 250. In some embodiments, the RF direction control module 250 is configured to direct RF signals transmitted from the RF power supply 104 by way of the match network 106 to either the showerhead electrode 150 or to the pedestal 140. Also, the RF direction control module 250 is configured to electrically connect whichever one of the showerhead electrode 150 and the pedestal 140 that is not currently receiving RF signals to a reference ground potential. In this manner, at a given time, the RF direction control module 250 operates to ensure that either the showerhead electrode 150 will receive RF signals from the RF power supply 104 while the pedestal 140 is electrically connected to the reference ground potential, or the pedestal 140 will receive RF signals from the RF power supply 104 while the showerhead electrode 150 is electrically connected to the reference ground potential.

The RF power supply 104 is controlled by a control module 110, e.g., a controller. The control module 110 is configured to operate the wafer processing system 100 by executing process input and control instructions/programs 108. The process input and control instructions/programs 108 may include process recipes, having directions for parameters such as power levels, timing parameters, process gases, mechanical movement of the wafer 101, etc., such as to deposit or form films over the wafer 101.

In some embodiments, the center column 141 can include lift pins, which are controlled by lift pin control 122. The lift pins are used to raise the wafer 101 from the pedestal 140 to allow an end-effector to pick up the wafer 101, and to lower the wafer 101 after being placed by the end-effector. The wafer processing system 100 further includes a gas supply system 112 that is connected to process gas supplies 114, e.g., gas chemistry supplies from a facility. Depending on the processing being performed, the control module 110 controls the delivery of process gases 114 via the gas supply system 112. The chosen process gases are then flowed into the showerhead electrode 150 and distributed in a processing volume defined between the showerhead electrode 150 and the wafer 101 disposed upon the pedestal 140.

Further, the process gases may be premixed or not. Appropriate valving and mass flow control mechanisms may be employed within the gas supply system 112 to ensure that the correct process gases are delivered during the deposition and plasma treatment phases of the process. Process gases exit the processing volume and flow through an exhaust outlet 143. A vacuum pump (such as a one or two stage mechanical dry pump, among other types) draws process gases out of the processing volume and maintains a suitably low pressure within the processing volume by a closed loop feedback controlled flow restriction device, such as a throttle valve or a pendulum valve.

Also shown is a carrier ring 200 that encircles an outer region of the pedestal 140. The carrier ring 200 is configured to support the wafer 101 during transport of the wafer 101 to or from the pedestal 140. The carrier ring 200 is configured to sit over a carrier ring support region that is a step down from a wafer support region in the center of the pedestal 140. The carrier ring 200 has an annular shaped disc structure and includes an outer edge side of its disc structure, e.g., outer radius, and a wafer edge side of its disc structure, e.g., inner radius, that is closest to where the wafer 101 sits. The wafer edge side of the carrier ring 200 includes a plurality of contact support structures which are configured to lift the wafer 101 when the carrier ring 200 is lifted by spider forks 180. The carrier ring 200 is therefore lifted along with the wafer 101 and can be rotated to another station, e.g., in a multi-station system. Carrier ring lift and/or rotate control signals 124 are generated by the control module 110 to control operation of the spider forks 180 to lift and/or rotate the carrier ring 200.

In some embodiments, the electrical insulating layer 507 is disposed on a top surface of the pedestal 140, and an electrically conductive layer 509 is disposed on the electrically insulating layer 507. The electrically conductive layer 509 is configured to support the wafer 101. Also, in these embodiments, the electrically conductive layer can be electrically connected to a positive terminal of a direct current (DC) power supply 521 by way of a low pass filter 525. The DC power supply 521 is also connected to be controlled by the control module 110. Therefore, in some embodiments, electrical current can be transmitted from the DC power supply 521 through the low pass filter 525 to the electrically conductive layer 509, in accordance with a prescribed recipe as provided by the process input and control instructions/ programs 108 and as executed by the control module 110.

Figure 1B:
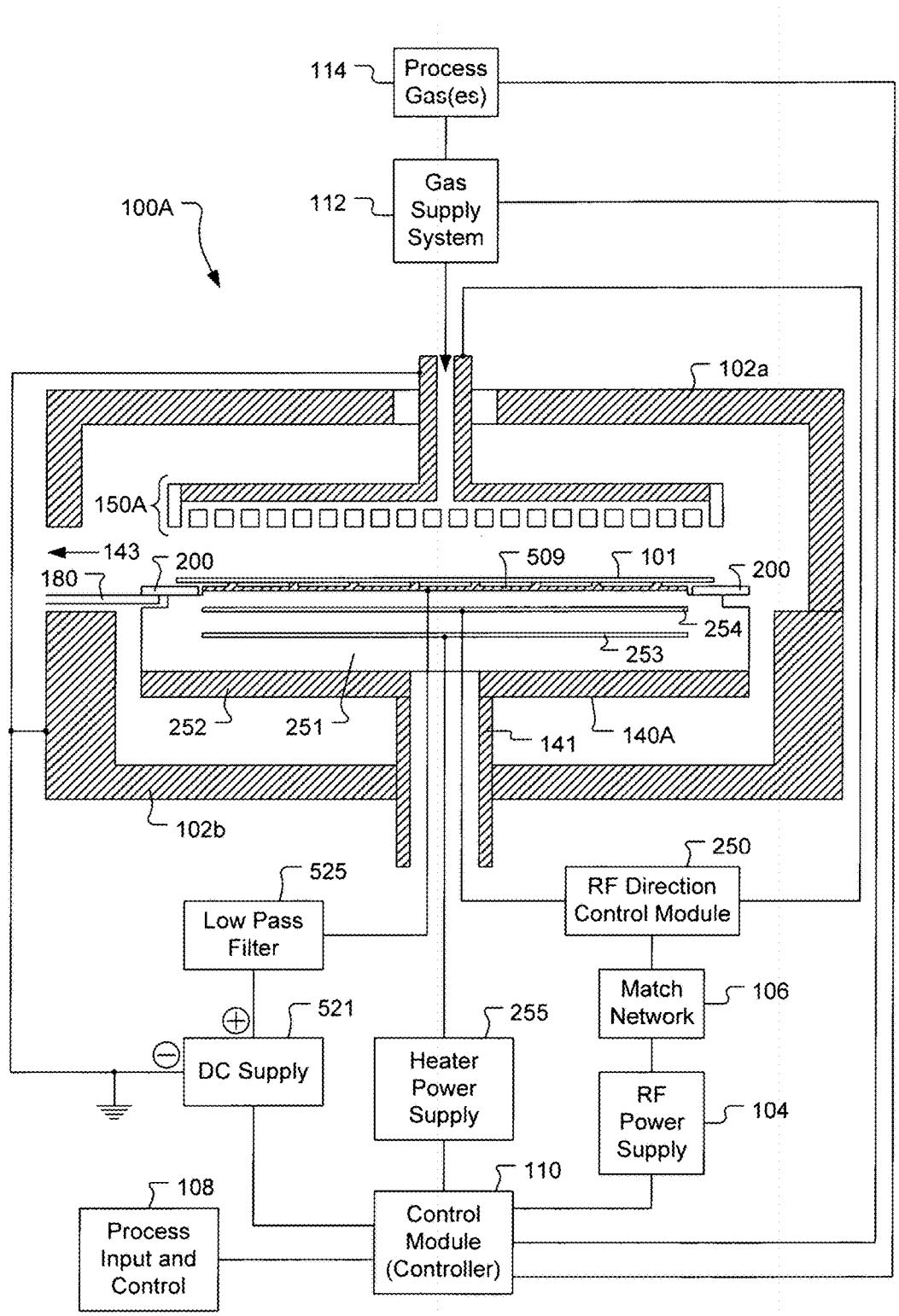
FIG. 1B shows a wafer processing system, in accordance with some embodiments of the present invention.

FIG. 1B illustrates a wafer processing system 100A that is configured to perform an atomic layer deposition (ALD) process on the wafer 101 (e.g. an ALD oxide process), in accordance with some embodiments of the present invention. Similar componentry as described with regard to FIG. 1A is shown in FIG. 1B. Specifically, the wafer processing system 100A also includes the upper chamber portion 102a, the lower chamber portion 102b, the control module 110, the RF power supply 104, the match network 106, the electrically conductive layer 509, the DC power supply 521, the low pass filter 525, the carrier ring 200, and the spider forks 180. In the wafer processing system 100A, a pedestal 140A is configured to include a dielectric body 251. In some embodiments, the dielectric body 251 is affixed directly to the column 141. And, in some embodiments, the dielectric body 251 is supported by a conductive structure 252 that is affixed to the column 141. The electrically conductive layer 509 is disposed directly upon a top surface of the dielectric body 251 of the pedestal 140A.

In some embodiments, a heating component 253, such as a resistance heating element, is disposed with the dielectric body 251 of the pedestal 140A. The heating component 253 is connected to a heater power supply 255, which is in turn connected to the control module 110. With the heating component 253 present, in some embodiments, the heater power supply 255 can be operated in accordance with a prescribed recipe as provided by the process input and control instructions/programs 108 and as executed by the control module 110. It should also be understood that temperature measurement devices can be installed on/within the pedestal 140A and/or at other locations around the pedestal 140A to provide temperature measurement data to the control module 110, thereby enabling operation of a closed-loop temperature feedback control circuit between the control module 110 and the heater power supply 255.

The dielectric body 251 of the pedestal 140A includes an RF electrode 254 configured and connected to receive RF signals from the RF power supply 104 by way of the match network 106, depending on the setting of an RF direction control module 250. Also, in the wafer processing system 100A of FIG. 1B, a showerhead electrode 150A is configured and connected to receive RF signals from the RF power supply 104 by way of the match network 106, depending on the setting of the RF direction control module 250. In some embodiments, the RF direction control module 250 is configured to direct RF signals transmitted from the RF power supply 104 by way of the match network 106 to either the showerhead electrode 150A or to the RF electrode 254. Also, the RF direction control module 250 is configured to electrically connect whichever one of the showerhead electrode 150A and the RF electrode 254 that is not currently receiving RF signals to a reference ground potential. In this manner, at a given time, the RF direction control module 250 operates to ensure that either the showerhead electrode 150A will receive RF signals from the RF power supply 104 while the RF electrode 154 is electrically connected to the reference ground potential, or the RF electrode 154 will receive RF signals from the RF power supply 104 while the showerhead electrode 150A is electrically connected to the reference ground potential.

Figure 2:
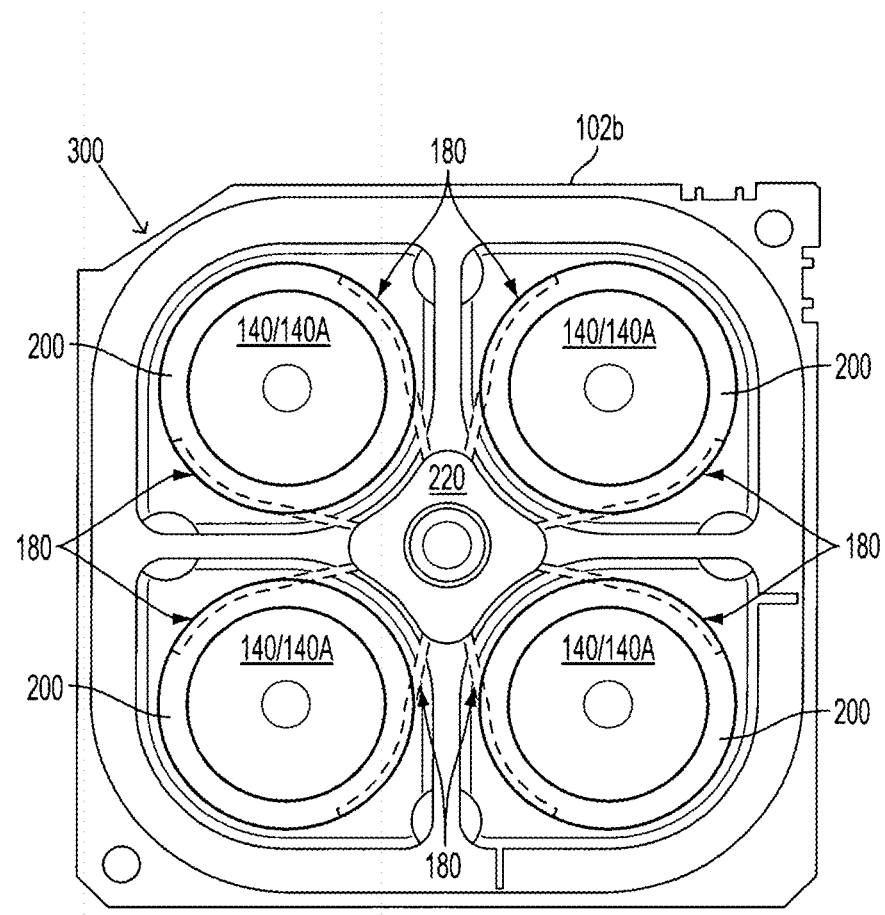
FIG. 2 shows a top view of a multi-station processing tool that includes four processing stations, in accordance with some embodiments of the present invention.

FIG. 2 shows a top view of a multi-station processing tool 300 that includes four processing stations, in accordance with some embodiments of the present invention. This top view is of the lower chamber portion 102b (e.g., with the top chamber portion 102a removed for illustration). The four processing stations are accessed by spider forks 180. Each spider fork 180, or fork, includes a first and second arm, each of which is positioned around a portion of each side of the pedestal 140/140A. The spider forks 180, using an engagement and rotation mechanism 220 are configured to raise up and lift the carrier rings 200 (i.e., from a lower surface of the carrier rings 200) from the processing stations in a simultaneous manner, and then rotate a distance of at least one or more stations before lowering the carrier rings 200 (where at least one of the carrier rings supports a wafer 101) so that further plasma processing, treatment and/or film deposition can take place on respective wafers 101.

Figure 3:
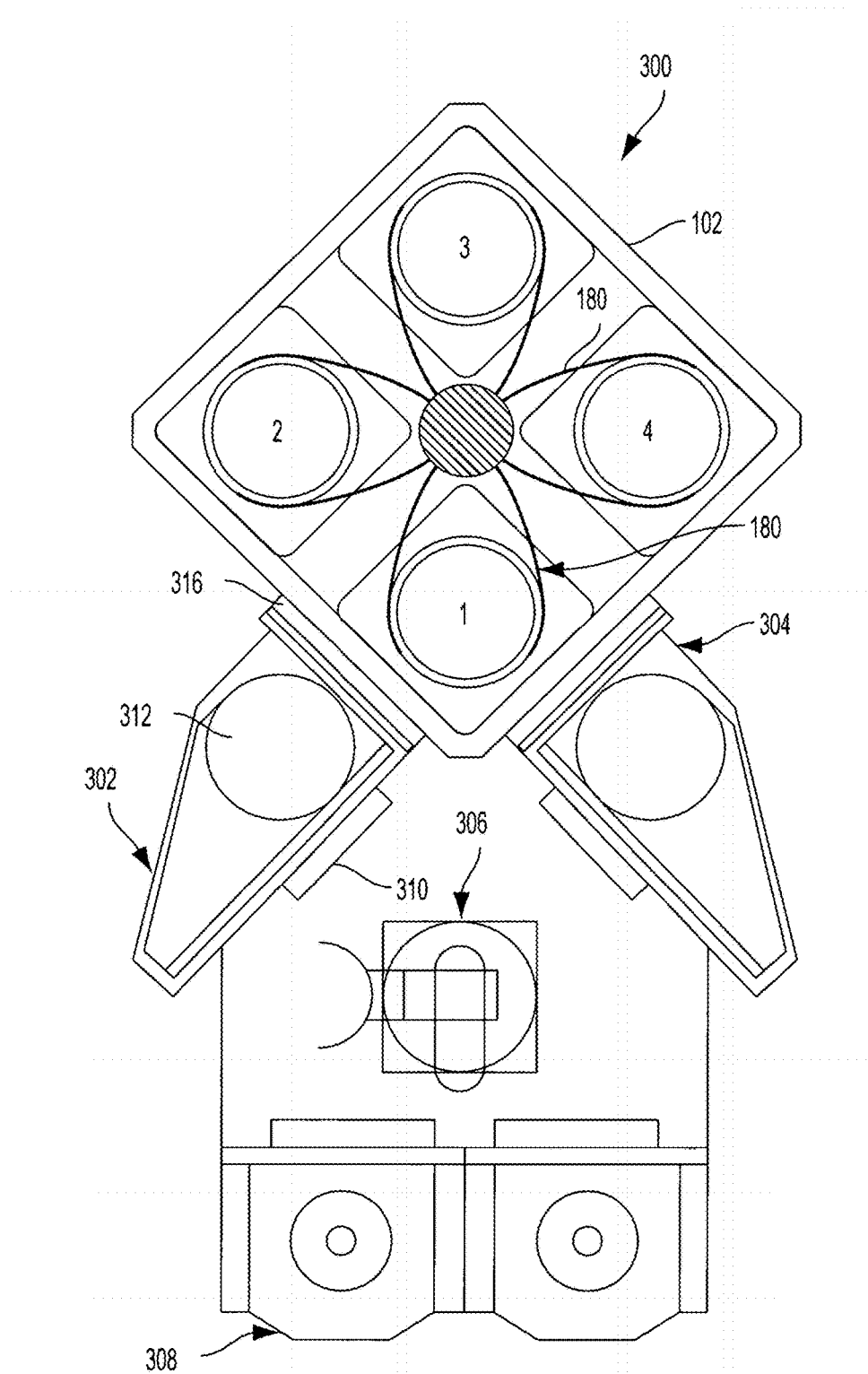
FIG. 3 shows a schematic view of an embodiment of the multi-station processing tool interfaced with an inbound load lock and an outbound load lock, in accordance with some embodiments of the present invention.

FIG. 3 shows a schematic view of an embodiment of the multi-station processing tool 300 interfaced with an inbound load lock 302 and an outbound load lock 304, in accordance with some embodiments of the present invention. A robot 306, at atmospheric pressure, is configured to move wafers 101 from a cassette loaded through a pod 308 into inbound load lock 302 via an atmospheric port 310. Inbound load lock 302 is coupled to a vacuum source/pump so that, when atmospheric port 310 is closed, inbound load lock 302 may be pumped down. Inbound load lock 302 also includes a chamber transport port 316 interfaced with processing chamber 102. Thus, when chamber transport 316 is opened, another robot 312 may move the wafer from inbound load lock 302 to the pedestal 140/140A of a first process station for processing.

The depicted processing chamber 102 comprises four process stations, numbered from 1 to 4 in the example embodiment shown in FIG. 3. In some embodiments, processing chamber 102 may be configured to maintain a low pressure environment so that wafers may be transferred using the carrier ring 200 among the process stations 1-4 without experiencing a vacuum break and/or air exposure. Each process station 1-4 depicted in FIG. 3 includes a pedestal 140/140A and showerhead electrode 150/150A and associated process gas supply connections. Also, it should be understood that in other embodiments the processing chamber 102 can include less than four process stations or more than four process stations.

FIG. 3 also shows the spider forks 180 for transferring wafers within the processing chamber 102. As mentioned above, the spider forks 180 rotate and enable transfer of wafers from one processing station to another. The transfer occurs by enabling the spider forks 180 to lift the carrier rings 200 from an outer undersurface, which lifts the wafers 101, and rotates the wafers 101 and carrier rings 200 together to the next processing station. In one configuration, the spider forks 180 are made from a ceramic material to withstand high levels of heat during processing.

Figure 4:
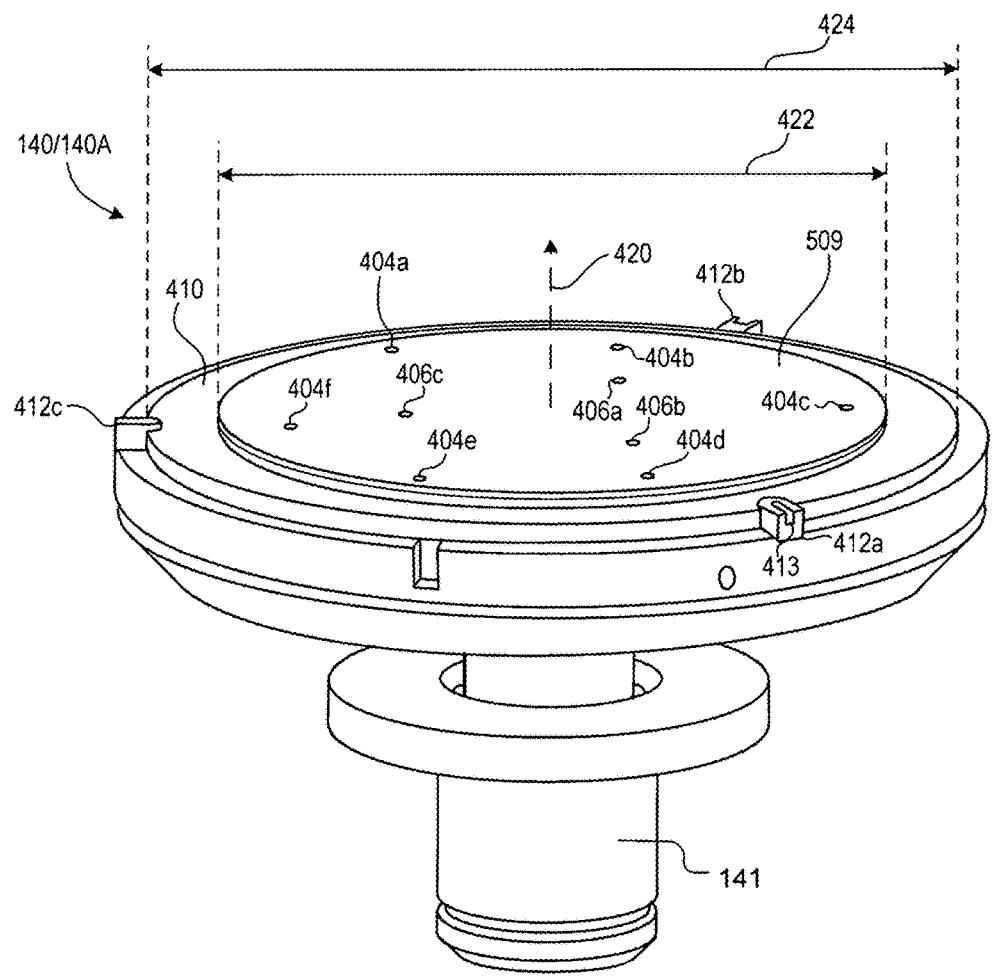
FIG. 4 shows an example of the pedestal configured to receive the wafer for a deposition process, in accordance with some embodiments of the present invention.

FIG. 4 shows an example of the pedestal 140/140A configured to receive the wafer 101 for a deposition process, such as an atomic layer deposition (ALD) process, in accordance with some embodiments of the present invention. The pedestal 140/140A includes the electrically conductive layer 509 positioned on a central top surface of the pedestal 140/140A, where the central top surface is defined by a circular area extending from a central axis 420 of the pedestal 140/140A to a top surface diameter 422 that defines the edge of the central top surface. The electrically conductive layer 509 includes a plurality of wafer supports 404a, 404b, 404c, 404d, 404e, and 404f, which are distributed across the electrically conductive layer 509 and which are configured to support the wafer 101. A wafer support level is defined by the vertical position of the bottom surface of the wafer 101 when seated on the wafer supports 404a, 404b, 404c, 404d, 404e, and 404f. In the example of FIG. 4, there are six wafer supports 404a, 404b, 404c, 404d, 404e, and 404f symmetrically distributed about a periphery of the electrically conductive layer 509. However, in other embodiments there may be any number of wafer supports on the electrically conductive layer 509, and the wafer supports can be distributed across the electrically conductive layer 509 in any suitable arrangement for supporting the wafer 101 during deposition process operations. FIG. 4 also shows recesses 406a, 406b, and 406c, which are configured to house lift pins. The lift pins can be utilized to raise the wafer 101 from the wafer supports 404a, 404b, 404c, 404d, 404e, and 404f to allow for engagement of the wafer 101 by an end-effector.

In some embodiments, each wafer support 404a, 404b, 404c, 404d, 404e, and 404f defines a minimum contact area structure (MCA). MCA's are used to improve precision mating between surfaces when high precision or tolerances are required, and/or minimal physical contact is desirable to reduce defect risk. Other surfaces in the system can also include MCA's, such as over the carrier ring 200 supports, and over the inner wafer support region of the carrier ring 200.

The pedestal 140/140A further includes an annular surface 410 extending from the top surface diameter 422 of the pedestal 140/140A to an outer diameter 424 of the annular surface 410. The annular surface 410 defines an annular region surrounding the electrically conductive layer 509, but at a step down from the electrically conductive layer 509. That is, the vertical position of the annular surface 410 is lower than the vertical position of the electrically conductive layer 509. A plurality of carrier ring supports 412a, 412b, and 412c are positioned substantially at/along the edge (outer diameter) of the annular surface 410 and are symmetrically distributed about the annular surface 410. The carrier ring supports can in some embodiments define MCA's for supporting the carrier ring 200. In some implementations, the carrier ring supports 412a, 412b, and 412c extend beyond the outer diameter 424 of the annular surface 410, whereas in other implementations they do not. In some implementations, the top surfaces of the carrier ring supports 412a, 412b, and 412c have a height that is slightly higher than that of the annular surface 410, so that when the carrier ring 200 is resting on the carrier ring supports 412a, 412b, and 412c, the carrier ring 200 is supported at a predefined distance above the annular surface 410. Each carrier ring support 412a, 412b, and 412c may include a recess, such as recess 413 of carrier ring support 412a, in which an extension protruding from the underside of the carrier ring 200 is seated when the carrier ring 200 is supported by the carrier ring supports 412a, 412b, and 412c. The mating of the carrier ring extensions to the recesses (413) in the carrier ring supports 412a, 412b, and 412c provides for secure positioning of the carrier ring 200 and prevents the carrier ring 200 from moving when seated on the carrier ring supports 412a, 412b, and 412c.

In some implementations, the top surfaces of the carrier ring supports 412a, 412b, and 412c are flush with the annular surface 410. In other implementations, there are no carrier ring supports separately defined from the annular surface 410, so that the carrier ring 200 may rest directly on the annular surface 410, and such that no gap exists between the carrier ring 200 and the annular surface 410. In such implementations, a pathway between the carrier ring 200 and the annular surface 410 is closed, preventing precursor materials from reaching a backside/underside of the wafer 101 via this pathway.

In the example embodiment of FIG. 4, there are three carrier ring supports 412a, 412b, and 412c positioned symmetrically along the outer edge region of the annular surface 410. However, in other implementations, there may be more than three carrier ring supports, distributed at any locations along the annular surface 410 of the pedestal 140/140A, to support the carrier ring 200 in a stable resting configuration.

When the wafer 101 is supported by the wafer supports 404a, 404b, 404c, 404d, 404e, and 404f, and when the carrier ring 200 is supported by the carrier ring supports 412a, 412b, and 412c, an edge region of the wafer 101 is disposed over an inner portion of the carrier ring 200. Generally speaking, the edge region of the wafer 101 extends from an outer edge of the wafer 101 inward by about 2 millimeters (mm) to about 5 mm. A vertical separation is thereby defined between the edge region of the wafer 101 and the inner portion of the carrier ring 200. In some embodiments, this vertical separation is about 0.001 inch to about 0.010 inch. The support of the carrier ring 200 at the predefined distance above the annular surface 410 and the vertical separation between the edge region of the wafer 101 and the inner portion of the carrier ring 200, can be controlled to limit deposition on a backside/underside of the wafer 101 in the edge region of the wafer 101.

Some plasmas used to deposit thin films or to treat the wafer surface are unstable under conditions that are preferred from a process standpoint. As an example, Ar/O2 capacitively-coupled-plasma (CCP) discharge operated within a 1 to 3 Torr pressure range and at high RF power (>200 W per 300 mm diameter wafer processing station) shows instabilities within the plasma. One such plasma instability, referred to herein as a "plasmoid," is characterized by small areas of higher density (brighter) plasma surrounded by larger volumes of normal density plasma. When plasmoids are formed, the deposited film is locally densified near the plasmoid due to interaction of the film with the local high density plasma corresponding to the plasmoid, which results in degraded film uniformity. A spatial distribution of plasmoids over the wafer 101 can vary from process-to-process, and within a given process. Also, the plasmoids can move across the wafer 101 during a given process. It should be understood that the plasmoids cause a degradation in process uniformity across the wafer 101, such as by changing a thickness of a deposited film at different locations across the wafer 101. The non-uniformity in film thickness caused by the plasmoids can be about 1% to 2% of the total film thickness, which can be significant in some applications that require an ultra-flat film profile.

During an example film deposition process, an operation is performed to apply a monolayer of a precursor gas, without applying any RF power. The precursor gas sticks to the wafer 101. In some embodiments, the precursor gas includes silicon to enable formation of silicon oxide on the wafer. An operation is then performed to flush the precursor gas from the processing volume over the wafer 101, thereby leaving the monolayer of the precursor gas on the wafer 101. An oxidation process is then performed on the wafer 101. In the oxidation process, a process gas is flowed into the processing volume over the wafer 101 and RF power is applied to the process gas to generate a plasma within the processing volume. The plasma drives oxidation reactions on the wafer 101. In some embodiments, the process gas will contain oxygen plus one or more other bombardment gases, such as argon, among others, where the bombardment gas(es) provide sufficient densification of the plasma. The bombardment gas is a gas that is effective in densifying a deposited film. Bombardment gases that densify the deposited film are those gases that can effectively transfer energy to the deposited film. In some embodiments, the bombardment gases are monoatomic noble gases, such as argon, among others, that do not react chemically with the deposited film and that lack vibrational or rotational molecular modes. For instance, in an example process, the process gas mixture can include about 5% to about 20% oxygen with the balance of the process gas mixture being argon. And, in other example processes, the percentage of oxygen to the bombardment gas in the process gas mixture can be less than 5% or greater than 20%.

During the oxidation process, when a particular thickness of film is formed on the wafer 101, the plasmoids may begin to appear across the wafer 101. The number and size of the plasmoids has a direct correlation with the amount of the bombardment process gas, e.g., argon, in the process gas mixture. So, reducing of the amount of bombardment process gas in the process gas mixture may serve to reduce the intensity of the plasmoids. However, the higher percentage of bombardment process gas is also typically necessary to provide sufficient plasma density to ensure proper film formation. Also, a large amount of RF power is needed to generate the plasma, because if there is not enough RF power applied, the plasma density will not be sufficient. However, increasing the applied RF power leads to formation of more plasmoids. Some process applications use about 300 W of applied RF power per 300 mm diameter wafer processing station. However, other process applications may require higher RF power, such as 400 W, or even higher, per 300 mm diameter wafer processing station.

In view of the foregoing, one approach for suppressing plasmoid formation is to reduce the applied RF power and/or increase the oxygen concentration within the gas mixture. More specifically, lower process power, i.e., lower applied RF power, or lower bombardment gas (typically argon) concentration within the process gas (with respect to oxygen) results in a lower plasma density, thus suppressing formation of plasmoids. Unfortunately, these conditions are not preferred from a deposited film quality perspective. For example, film quality is degraded when ion bombardment from the plasma is not sufficient at lower process power or lower bombardment gas concentration within the process gas. Therefore, it may not always be possible to maintain deposited film quality while suppressing plasmoid formation through lowering of the process power and/or lowering of the bombardment gas concentration, e.g., argon concentration, within the process gas.

Systems and methods are disclosed herein to prevent/suppress plasma instability by modulating electrical potential of the wafer 101. In some embodiments, a low positive DC bias is applied to the backside/underside of the wafer 101. This low positive DC bias is effective in suppressing the formation of plasmoids. The systems and methods disclosed herein for suppression and/or prevention of plasma instability does not require changes in other process conditions, such as process gas flow rates, pressure, and/or applied RF power.

Figure 5A:
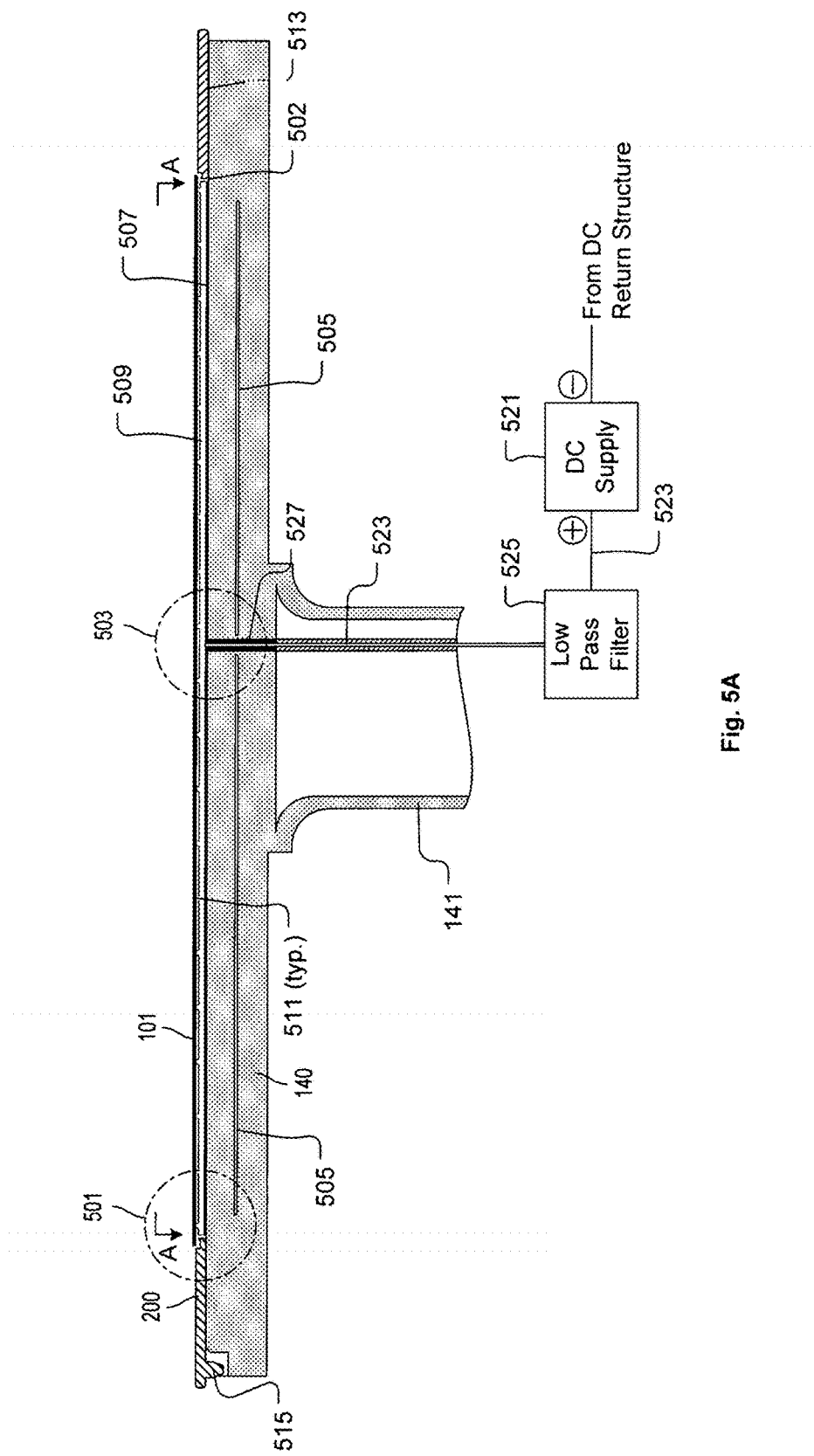
FIG. 5A shows a vertical cross-section view of the pedestal, in accordance with some embodiments of the present invention.

FIG. 5A shows a vertical cross-section view of the pedestal 140 of FIG. 1A, in accordance with some embodiments of the present invention. In some embodiments, the pedestal 140 is formed of an electrically conductive material, such as aluminum, among other materials. In some embodiments, the pedestal 140 includes heating devices 505, such as electrical resistance heaters. The pedestal 140 includes a top surface 502. The electrical insulating layer 507 is disposed on the top surface 502 of the pedestal 140. The electrical insulating layer 507 is formed of a dielectric material that is compatible with the materials used in the processing of the wafer 101 and that is stable with regard to thermal expansion during processing of the wafer 101. In various embodiments, during processing of the wafer 101, the pedestal 140 can be exposed to temperatures within a range extending up to about 100° Celsius (C), or within a range extending from about 20° C. to about 100° C., or to temperatures within a range extending up to about 50° C., or to temperatures within a range extending up to about 250° C.

In some embodiments, the electrical insulating layer 507 is formed of a ceramic material, such as a ceramic plate or ceramic coating. In some embodiments, the electrical insulating layer 507 is formed by anodizing the top surface 502 of the pedestal 140. In some embodiments, the electrical insulating layer 507 has a vertical thickness as measured in a direction perpendicular to the top surface 502 of the pedestal 140 within a range extending up to about 1 millimeter (mm), or within a range extending up to about 100 micrometers, or within a range extending from about 10 micrometers to about 50 micrometers, or of about 30 micrometers. It should be understood, however, that in other embodiments the vertical thickness of the electrical insulating layer 507 as measured in the direction perpendicular to the top surface 502 of the pedestal 140 can be different than the above-mentioned ranges and values. The vertical thickness of the electrical insulating layer 507 is defined to ensure that electrical current does not flow through the electrical insulating layer 507 to the pedestal 140.

The electrically conductive layer 509 is disposed on the electrically insulating layer 507. The electrically conductive layer 509 is configured to support the wafer 101. In some embodiments, the electrically conductive layer 509 is formed to have a vertical thickness as measured perpendicular to the top surface 502 of the pedestal 140 within a range extending up to about 1 mm, or within a range extending up to about 0.25 inch, or within a range extending up to about 0.5 inch. It should be understood, however, that in other embodiments the vertical thickness of the electrically conductive layer 509 as measured in the direction perpendicular to the top surface 502 of the pedestal 140 can be different than the above-mentioned ranges and values. In some embodiments, the electrically conductive layer 509 is formed as a solid plate. In some embodiments, the electrically conductive layer 509 is formed as a laminated film. In some embodiments, the electrically conductive layer 509 is formed as a sprayed metal coating. In some embodiments, the electrically conductive layer 509 is formed of aluminum. However, it should be understood that in other embodiments the electrically conductive layer 509 can be formed of essentially any type of electrically conductive material that is compatible with the materials used in the processing of the wafer 101 and that is stable with regard to thermal expansion during processing of the wafer 101.

In some embodiments, the electrically conductive layer 509 includes a distribution of MCA's 511 configured to contact and support the wafer 101. In these embodiments, the MCA's 511 are formed of electrically conductive material to provide for transmission of electrical current from the electrically conductive layer 509 to the wafer 101. In some embodiments, the MCA's 511 are formed of a same material as the electrically conductive layer 509. In some embodiments, the MCA's 511 are formed of a different material than the electrically conductive layer 509, so long as the MCA's 511 are formed of an electrically conductive material. In some embodiments, the MCA's 511 are formed integrally with the electrically conductive layer 509. In some embodiments, the MCA's 511 are physically attached to the electrically conductive layer 509. In some embodiments, the MCA's 511 are configured to have a rounded top surface that contacts the backside/underside of the wafer 101. In some embodiments, the MCA's 511 are configured to have a substantially flat top surface that contacts the backside/underside of the wafer 101.

The electrically conductive layer 509 is electrically connected to the DC power supply 521, through an electrical connection 523 that extends through the low pass filter 525. The low pass filter 525 prevents RF signals from entering and damaging the DC power supply 521. A positive terminal of the DC power supply 521 is connected to the electrical connection 523, such that direct electrical current flows through the electrical connection 523, including through the low pass filter 525, to the electrically conductive layer 509, and through the wafer 101 into the plasma within the processing volume overlying the wafer 101. A negative terminal of the DC power supply 521 is connected to an electrical current return structure within the chamber to provide for completion of the circuit. In various embodiments, the electrical connection 523 can be connected to the electrically conductive layer 509 in different ways such as through a soldered connection, a brazed connection, a compression connection, a threaded connection, among others. Electrical conductors that form the electrical connection 523 and/or the contact with the electrically conductive layer 509 are electrically insulated from the pedestal 140 by one or more electrical insulating structures 527. Also, if the pedestal 140 includes heating devices 505, such as electrical resistance heaters, the electrical insulating structures 527 are formed to electrically insulate the heating devices 505 from the electrical connection 523.

Additionally, in some embodiments, at least one of the lift pins within the pedestal 140 is formed of an electrically conductive material, and is configured to electrically contact the electrically conductive layer 509 when retracted to its down position within the pedestal 140, and is electrically connected to the DC power supply 521 through the electrical connection 523 and the low pass filter 525. In these embodiments, the at least one DC powered lift pin can be used to provide electrical connection with the electrically conductive layer 509 in lieu of, or in addition to, forming a permanent contact between the electrically conductive layer 509 and the electrical connection 523.

Figure 5B:
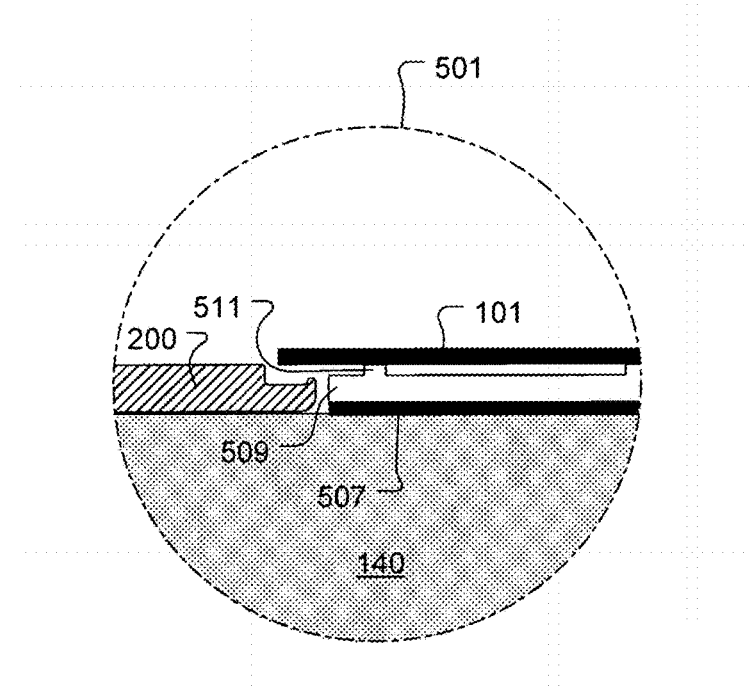
FIG. 5B shows a close-up view of the region 501 referenced in FIG. 5A, in accordance with some embodiments of the present invention.
Figure 5C:
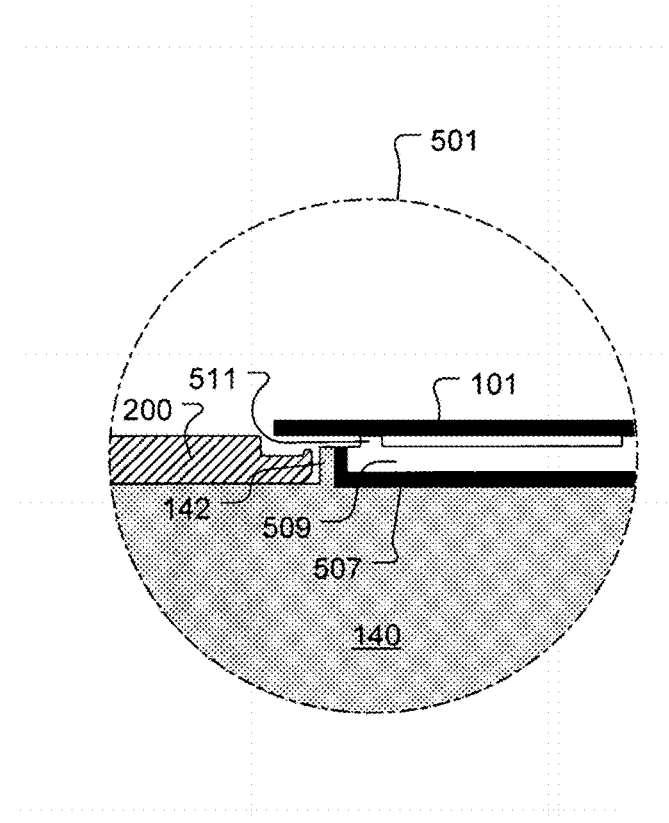
FIG. 5C also shows a close-up view of the region 501 referenced in FIG. 5A, in accordance with some embodiments of the present invention.

FIG. 5A also shows the carrier ring 200 which sits in the outer region of the pedestal 140 over a carrier support surface 513. The carrier ring 200 can include a plurality of extensions 515 which secure the carrier ring 200 to prevent the carrier ring 200 from shifting during processing of the wafer 101. The extensions 515 are configured to sit in the carrier ring supports 412a, 412b, and 412c, as shown in FIG. 4A. FIG. 5B shows a close-up view of the region 501 referenced in FIG. 5A, in accordance with some embodiments of the present invention. FIG. 5C also shows a close-up view of the region 501 referenced in FIG. 5A, in accordance with some embodiments of the present invention. In the example embodiment of FIG. 5C, the pedestal 140 includes a retainer structure 142 configured to extend upward from the top surface 502 of the pedestal 140, and configured to circumscribe the region within which the electrical insulating layer 507 and the electrically conductive layer 509 are formed. Also, in the example embodiment of FIG. 5C the electrical insulating layer 507 is formed to extend upward along an inner surface of the retainer structure 142 to provide for electrical insulation between the retainer structure 142 and the electrically conductive layer 509.

Figure 5D:
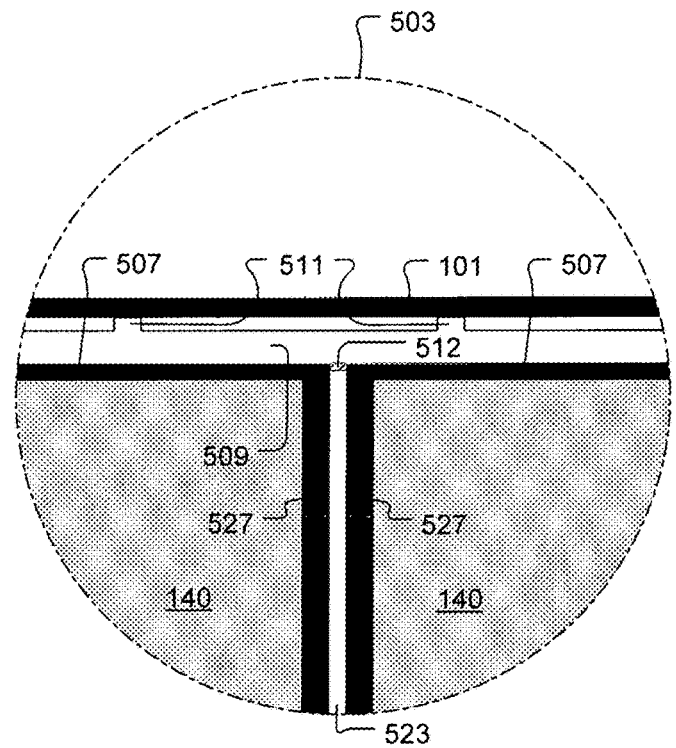
FIG. 5D also shows a close-up view of the region 503 referenced in FIG. 5A, in accordance with some embodiments of the present invention.
Figure 5E:
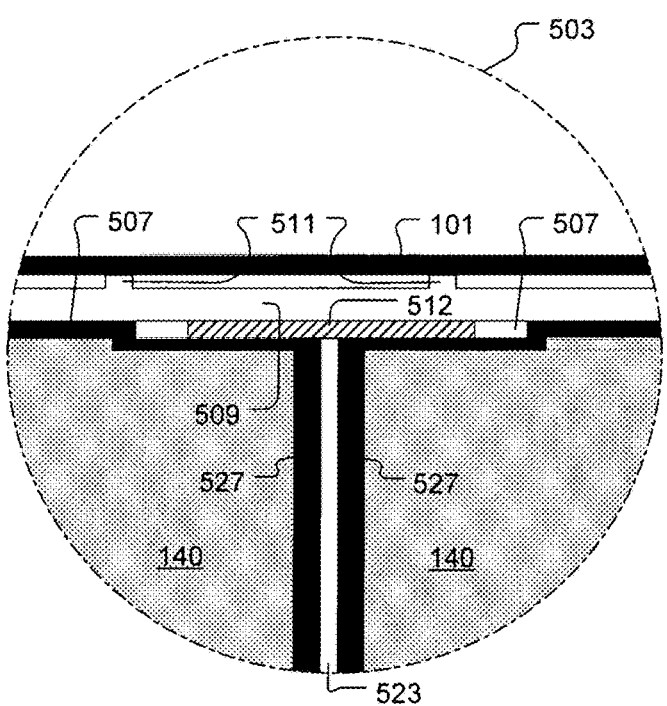
FIG. 5E also shows a close-up view of the region 503 referenced in FIG. 5A, in accordance with some embodiments of the present invention.

FIG. 5D also shows a close-up view of the region 503 referenced in FIG. 5A, in accordance with some embodiments of the present invention. In the example embodiment of FIG. 5D, an electrical connection 512 is shown as formed between the electrically conductive layer 509 and the electrical connection 523. In various embodiments, the electrical connection 523 can be a soldered connection, a brazed connection, a compression connection, a threaded connection, among others. FIG. 5E also shows a close-up view of the region 503 referenced in FIG. 5A, in accordance with some embodiments of the present invention. In the example embodiment of FIG. 5E, the electrical connection 512 is formed as a wider, pad-type structure between the electrically conductive layer 509 and the electrical connection 523. In the example embodiment of FIG. 5E, the electrical insulating layer 507 is formed to wrap around the electrical connection 523.

During operation, the DC power supply 521 can be operated to cause a flow of DC electrical current from the DC power supply 521 through the electrical connection 523, including through the low pass filter 525, to the electrically conductive layer 509, through the MCA's 511 supporting the wafer 101, through the wafer 101, to the plasma overlying the wafer 101, and through the plasma to an electrically conductive return structure in contact with the plasma. Positive electrical charges near the wafer 101 caused by the DC electrical current serve to repel positively charged ions within the plasma overlying the wafer 101, which serves to suppress formation of plasmoids at the wafer 101 surface. In some embodiments, the DC electrical current transmitted from the DC power supply 521 is within a range extending up to 100 milliAmperes (mA), or within a range extending from about 30 mA to about 70 mA. It should be understood, however, that in some embodiments the DC electrical current transmitted from the DC power supply 521 can be different than the above-mentioned ranges and values. In some embodiments, a voltage applied by the DC power supply 521 to the electrical connection 523 is within a range extending up to about +30 volts (V), or within a range extending from about −10 V to about +50 V, or within a range extending from about +20 V to about +40 V, or within a range extending from about +10 V to about +30 V. It should be understood, however, that in some embodiments the voltage applied by the DC power supply 521 can be different than the above-mentioned ranges and values.

Figure 5F:
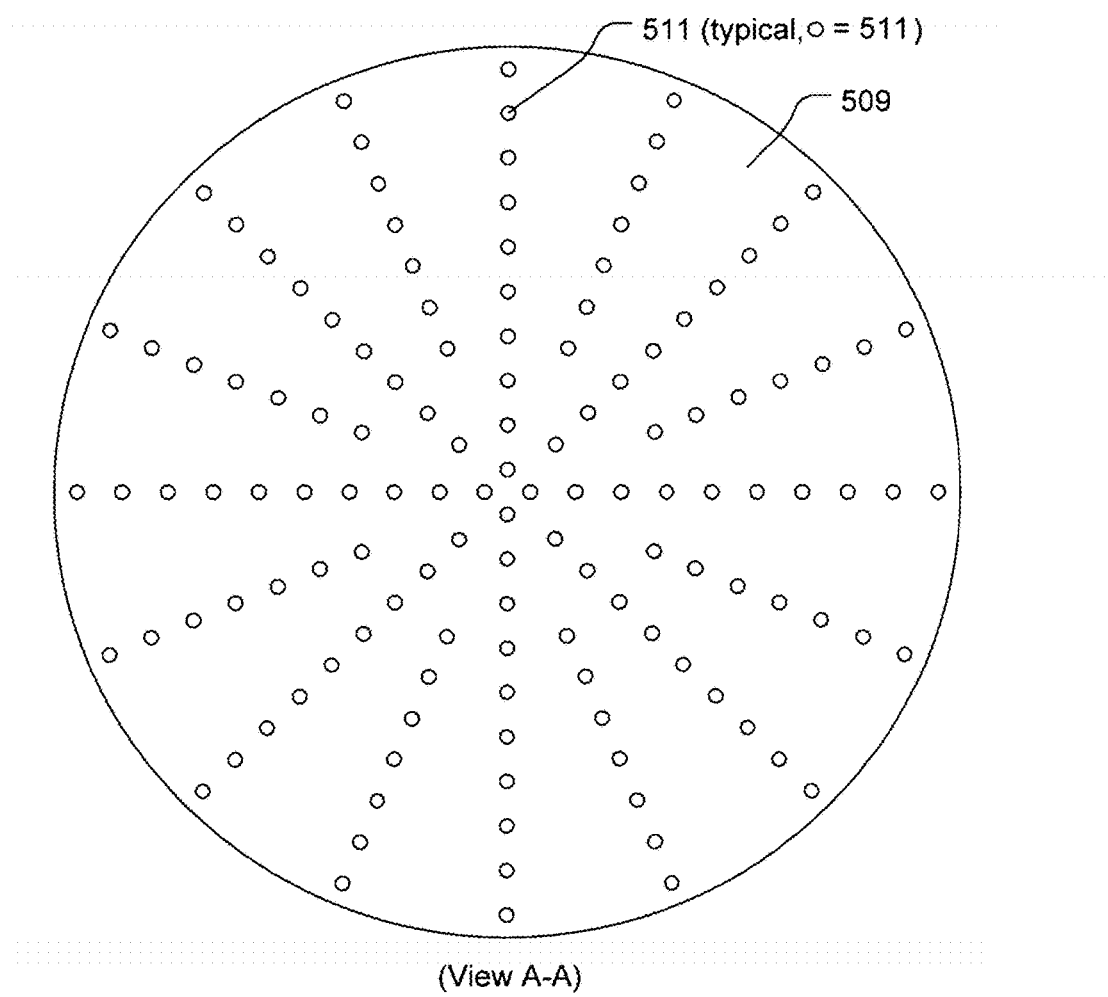
FIG. 5F shows a top view of the electrically conductive layer corresponding to referenced view A-A as identified in FIG. 5A, in accordance with some embodiments of the present invention.

Because the DC electrical current supplied from the DC power supply 521 flows to the wafer 101 through the MCA's 511, the spatial arrangement of the MCA's 511 may have an effect on the spatial distribution of the DC electrical current flow from the wafer 101 to the plasma, and in turn have a spatial effect on the suppression of plasmoid formation across the wafer 101. FIG. 5F shows a top view of the electrically conductive layer 509 corresponding to referenced view A-A as identified in FIG. 5A, in accordance with some embodiments of the present invention. In the example embodiment of FIG. 5F, the MCA's 511 (corresponding to the small circles denoted by 511 (typ.)) are distributed in a substantially uniform manner across the electrically conductive layer 509 so as to contact the backside/underside of the wafer 101 with a substantially uniform spatial arrangement. The spatial arrangement of the MCA's 511 can be used to increase/decrease electrical conductance to the wafer 101 in different spatial areas, and thereby provide for spatial control of the plasmoid suppression. For example, in some embodiments, more MCA's 511 can be provided at locations where higher plasmoid formation is expected, so as to provide for increase flow of DC electrical current through the wafer 101 at those locations.

Figure 5G:
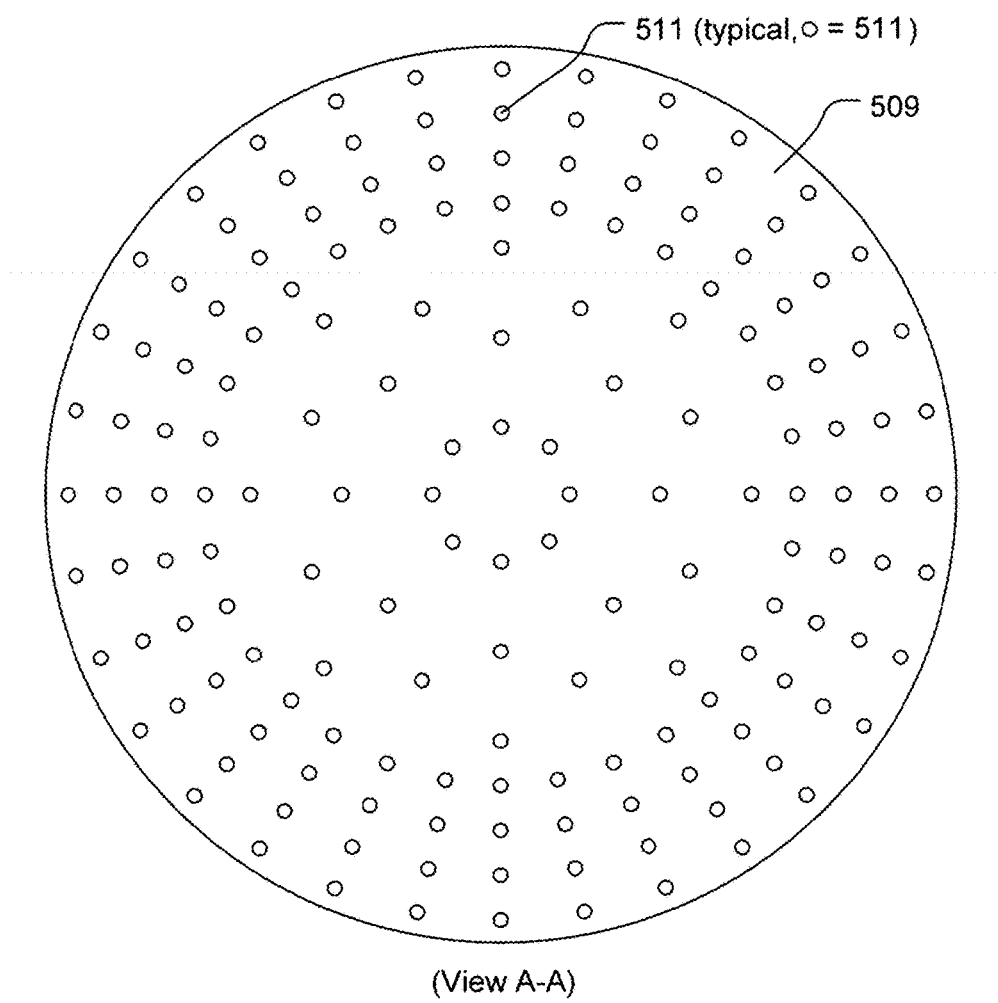
FIG. 5G shows a top view of the electrically conductive layer corresponding to referenced view A-A as identified in FIG. 5A, in accordance with some embodiments of the present invention.

FIG. 5G shows a top view of the electrically conductive layer 509 corresponding to referenced view A-A as identified in FIG. 5A, in accordance with some embodiments of the present invention. In the example embodiment of FIG. 5G, a spatial density of the MCA's 511 is increased toward an outer radial periphery of the electrically conductive layer 509. Therefore, the spatial arrangement of the MCA's 511 in the example embodiment of FIG. 5G may be used in processing applications where increased plasmoid formation is expected near the outer radial region of the wafer 101. It should be understood that the MCA 511 spatial arrangements depicted in the example embodiments of FIGS. 5F and 5G are provided for purposes of description and do not represent all possible spatial arrangements of the MCA's 511 across the electrically conductive layer 509. In other embodiments, the MCA's 511 can have essentially any spatial arrangement that provides for adequate structural support of the wafer 101 and that provides for a suitable distribution of DC electrical current flow from the electrically conductive layer 509 to the wafer 101.

Figure 6:
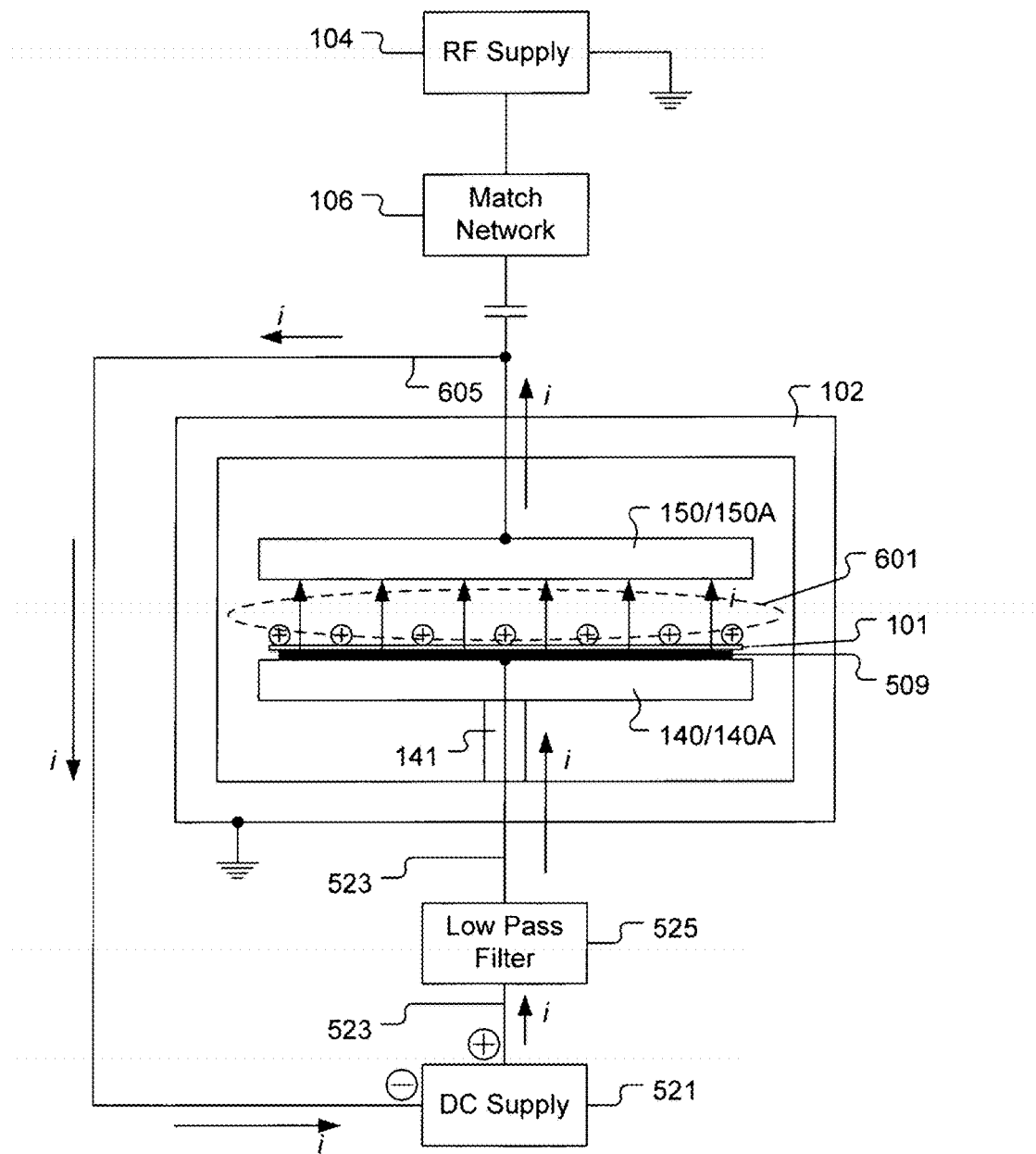
FIG. 6 shows a schematic of DC electrical current flow from the DC power supply through the chamber, in accordance with some embodiments of the present invention.

FIG. 6 shows a schematic of DC electrical current flow from the DC power supply 521 through the chamber 102, in accordance with some embodiments of the present invention. FIG. 6 shows the showerhead electrode 150/150A connected to receive RF signals from the RF power supply 104 by way of the match network 106 to generate a plasma 601 within the region overlying the wafer 101. In the example embodiment of FIG. 6, the showerhead electrode 150/150A is connected to the return (negative terminal) of the DC power supply 521, as indicated by electrical connections 605, where the return (negative terminal) of the DC power supply 521 is electrically connected to a reference ground potential. In this manner, the DC electrical current (i) flows from the DC power supply 521, through the low pass filter 525, to the electrically conductive layer 509, as indicated by electrical connection 523, and through the MCA's 511 to the wafer 101, and through the wafer 101 to the plasma 601, and through the plasma 601 to the showerhead electrode 150/150A, and from the showerhead electrode 150/150A through electrical connection 605 to the return (negative terminal) of the DC power supply 521.

Figure 7:
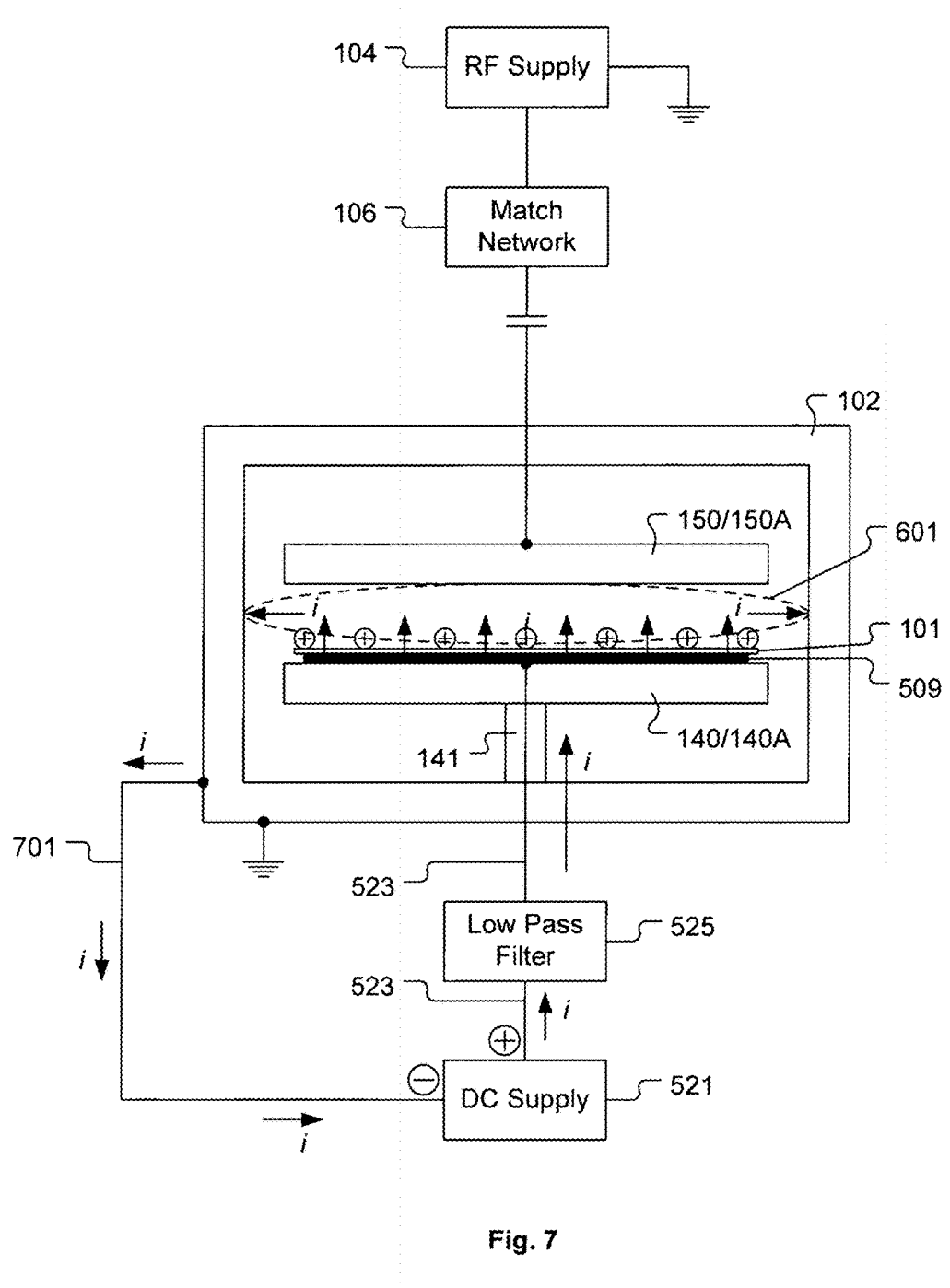
FIG. 7 shows an alternate schematic of DC electrical current flow from the DC power supply through the chamber, in accordance with some embodiments of the present invention.

FIG. 7 shows an alternate schematic of DC electrical current flow from the DC power supply 521 through the chamber 102, in accordance with some embodiments of the present invention. The example embodiment of FIG. 7 corresponds to a low pressure processing application in which the plasma 601 contacts the wall of the chamber 102. In the example embodiment of FIG. 7, the wall of the chamber 102 functions as a return electrode for the DC electrical current (i) that flows from the DC power supply 521. More specifically, the wall of the chamber 102 is electrically connected to the return (negative terminal) of the DC power supply 521 through an electrical connection 701. During operation, the DC electrical current (i) flows from the DC power supply 521, through the low pass filter 525, to the electrically conductive layer 509, as indicated by electrical connection 523, and through the MCA's 511 to the wafer 101, and through the wafer 101 to the plasma 601, and through the plasma 601 to the wall of the chamber 102, and from the wall of the chamber 102 through the electrical connection 701 to the return (negative terminal) of the DC power supply 521.

As discussed above, in various wafer 101 processing applications, the wafer 101 is loaded onto a processing station, such as a deposition station, and is placed on the electrically conductive layer 509 of the pedestal 140/140A. The wafer 101 is supported by a set of conductive pins/structures, such as the MCA's 511, that are electrically connected to the electrically conductive layer 509. Then, DC voltage is applied from the external DC power supply 521 to the wafer 101 through the electrically conductive layer 509 and through the conductive pins/structures, e.g., through the MCA's 511. The applied DC voltage is used to reduce the energy flux of (positive) ions within the plasma that are incident upon the wafer 101. Energetic ions from the plasma may eject secondary electrons from the film material deposited on the wafer 101. These secondary electrons can be accelerated to high energy when pulled into the bulk plasma through the plasma sheath. These accelerated electrons may form regions of high-density, unstable plasma, such as the plasmoids. Such a behavior is observed in argon-rich gas mixtures when discharge interacts with specific surfaces (e.g., film of specific composition and thickness). In order to shift wafer potential, the applied DC voltage generates a non-zero flow of DC electrical current. Without the non-zero flow of DC electrical current, application of the external DC voltage may be ineffective due to an ability of the plasma to shadow wafer 101 surface charge with charges of opposite sign, thereby restoring a floating potential of the wafer 101.

It should be appreciated that the system and methods disclosed herein for suppressing plasma instabilities, such as plasmoids, adds a minimum perturbation to the processing system. The DC bias applied to the backside/underside of a wafer 101 serves as a process tuning parameter which may be adjusted to eliminate plasmoids while having minimal impact on the discharge and the process. Flow rate, pressure, RF power, and other parameters can remain the same with application of the DC bias to the backside/underside of the wafer 101.

Application of DC bias to the wafer backside/underside of the wafer 101 is not common. In some situations, DC bias may be applied to the RF powered electrode, e.g., to the showerhead electrode 150/150A, to modulate global plasma structure. However, application of DC bias to the showerhead electrode 150/150A does not suppress plasmoids because DC current primarily flows between showerhead electrode 150/150A and the wall of the chamber 102, with minimum effect on the plasma-to-wafer interface. In contrast to applying DC bias to the showerhead electrode 150/150A, the systems and methods disclosed herein establish a DC electrical connection with the backside/underside of the wafer 101. And, in some embodiments, this DC electrical connection to the backside/underside of the wafer 101 is established by multiple conductive wafer support structures, e.g., MCA's 511, distributed spatially across the backside/underside of the wafer 101. These multiple conductive wafer support structures create low electrical resistance contact with the wafer 101 and conduct DC current to the wafer 101 so as to modify the electric potential of the wafer 101. Generally speaking, various methods for increasing the electric potential of the wafer 101 may serve to reduce the likelihood of plasmoid formation. In an alternate embodiment, even DC grounding of the wafer 101 may serve to reduce some plasma instability, as opposed to having the wafer 101 be at a floating electric potential. Such an alternate embodiment may be considered a special case of DC biasing with zero voltage.

In view of the foregoing, it should be understood that an apparatus for supporting a wafer during a plasma processing operation is disclosed herein. The apparatus includes the pedestal 140/140A configured to have bottom surface and a top surface. The apparatus also includes the column 141 configured to support the pedestal 140/140A at a central region of the bottom surface of the pedestal 140/140A. In some embodiments, the column 141 is configured to rotate. And, in these embodiments, the column 141 is fixed to the pedestal 140/140A such that rotation of the column 141 causes corresponding rotation of the pedestal 140/140A. The apparatus includes an electrical insulating layer 507 disposed over the top surface of the pedestal 140/140A. In some embodiments, the electrical insulating layer 507 is formed integrally with the pedestal, such as shown in FIG. 1B. The apparatus also includes an electrically conductive layer 509 disposed over the top surface of the electrical insulating layer 507. The apparatus also includes at least three support structures 511 distributed on the electrically conductive layer 509. Each of the at least three support structures 511 is formed of electrically conductive material and is secured in electrical contact with the electrically conductive layer 509. The at least three support structures 511 are configured to interface with a bottom surface of a wafer 101 to physically support the wafer 101 and electrically connect to the wafer 101. The apparatus also includes an electrical connection 523 extending from the electrically conductive layer 509 to a location outside of the pedestal 140/140A. The electrical connection 523 is electrically connected to the positive terminal of the direct current power supply 521.

In some embodiments, the electrical insulating layer 507 has a vertical thickness as measured in a direction perpendicular to the top surface of the pedestal 140/140A at least large enough to prevent flow of electrical current from the electrically conductive layer 509 to an electrically conductive material located within the pedestal 140/140A below the electrical insulating layer 507. In some embodiments, the electrical insulating layer 507 has a vertical thickness as measured in a direction perpendicular to the top surface of the pedestal 140/140A within a range extending up to about 1000 micrometers, or within a range extending up to about 100 micrometers, or within a range extending from about 10 micrometers to about 50 micrometers, or of about 30 micrometers. It should be understood, however, that in other embodiments the vertical thickness of the electrical insulating layer 507 as measured in the direction perpendicular to the top surface of the pedestal 140/140A can be different than the above-mentioned ranges and values. In some embodiments, the electrically conductive layer 509 has a vertical thickness as measured in a direction perpendicular to the top surface of the pedestal 140/140A within a range extending up to about 1 millimeter, or within a range extending up to about 7 millimeters, or within a range extending up to about 13 millimeters. It should be understood, however, that in other embodiments the vertical thickness of the electrically conductive layer 509 as measured in the direction perpendicular to the top surface of the pedestal 140/140A can be different than the above-mentioned ranges and values. In various embodiments, the electrically conductive layer 509 is formed as either a plate, or a laminated film, or a sprayed coating.

In some embodiments, the at least three support structures 511 are distributed in a substantially uniform manner across the electrically conductive layer 509, such as shown in FIG. 5F, by way of example. In some embodiments, the at least three support structures 511 are distributed in a non-uniform manner across the electrically conductive layer 509, such as shown in FIG. 5G, by way of example. In some embodiments, a larger number of the at least three support structures 511 are positioned near a peripheral region of the electrically conductive layer 509 as compared to near a central region of the electrically conductive layer 509.

In some embodiments, both the at least three support structures 511 and the electrically conductive layer 509 are formed of a same material. And, in some embodiments, the electrically conductive layer 509 is formed of a material different than a material of which the at least three support structures 511 are formed, with the at least three support structures 511 formed of an electrically conductive material. In some embodiments, both the at least three support structures 511 and the electrically conductive layer 509 are formed as a single integral structure. In some embodiments, the at least three support structures 511 are attached to the electrically conductive layer 509. Also, in some embodiments, each of the at least three support structures 511 is configured to have a rounded top surface for interfacing with the bottom surface of the wafer 101.

Also, in view of the foregoing, it should be understood that a system for plasma processing of a wafer is disclosed herein. The system includes the direct current power supply 521 that has the positive terminal and the negative terminal. The system also includes a low pass filter circuit, e.g., low pass filter 525, that has an input connection and an output connection, with the input connection of the low pass filter circuit 525 electrically connected to the positive terminal of the direct current power supply 521. The system also includes a wafer support apparatus that includes at least three support structures 511 distributed to physically contact and support a bottom surface of the wafer 101. Each of the at least three support structures 511 is formed of electrically conductive material. And, each of the at least three support structures 511 is electrically connected to the output connection of the low pass filter circuit 525.

In some embodiments, the wafer support apparatus includes the electrically conductive layer 509, with the at least three support structures 511 physically and electrically connected to the electrically conductive layer 509, and with the electrically conductive layer 509 being electrically connected to the output connection of the low pass filter circuit 525. Also, in some embodiments, the wafer support apparatus includes the pedestal 140/140A configured to have a bottom surface and a top surface. And, the wafer support apparatus includes the electrical insulating layer 507 disposed below the electrically conductive layer 509. And, in some embodiments, the wafer support apparatus includes the column 141 configured to support the pedestal 140/140A at a central region of the bottom surface of the pedestal 140/140A. In some embodiments, the column 141 is configured to rotate, with the column 141 fixed to the pedestal 140/140A such that rotation of the column 141 causes corresponding rotation of the pedestal 140/140A.

The system also includes an electrode, such as the showerhead electrode 150/150A, by way of example, positioned above the wafer support apparatus. A plasma generation region is located between the electrode 150/150A and the wafer support apparatus. The system also includes the radiofrequency power supply 104 connected to deliver radiofrequency power to the electrode 150/150A. The system also has the negative terminal of the direct current power supply 521 electrically connected to at least one electrically conductive structure exposed to the plasma generation region. In some embodiments, such as shown in FIG. 6, the at least one electrically conductive structure exposed to the plasma generation region is the electrode 150/150A. In some embodiments, such as shown in FIG. 7, the at least one electrically conductive structure exposed to the plasma generation region is a wall of the chamber 102 in which the electrode 150/150A and the wafer support apparatus are disposed.

Figure 8:
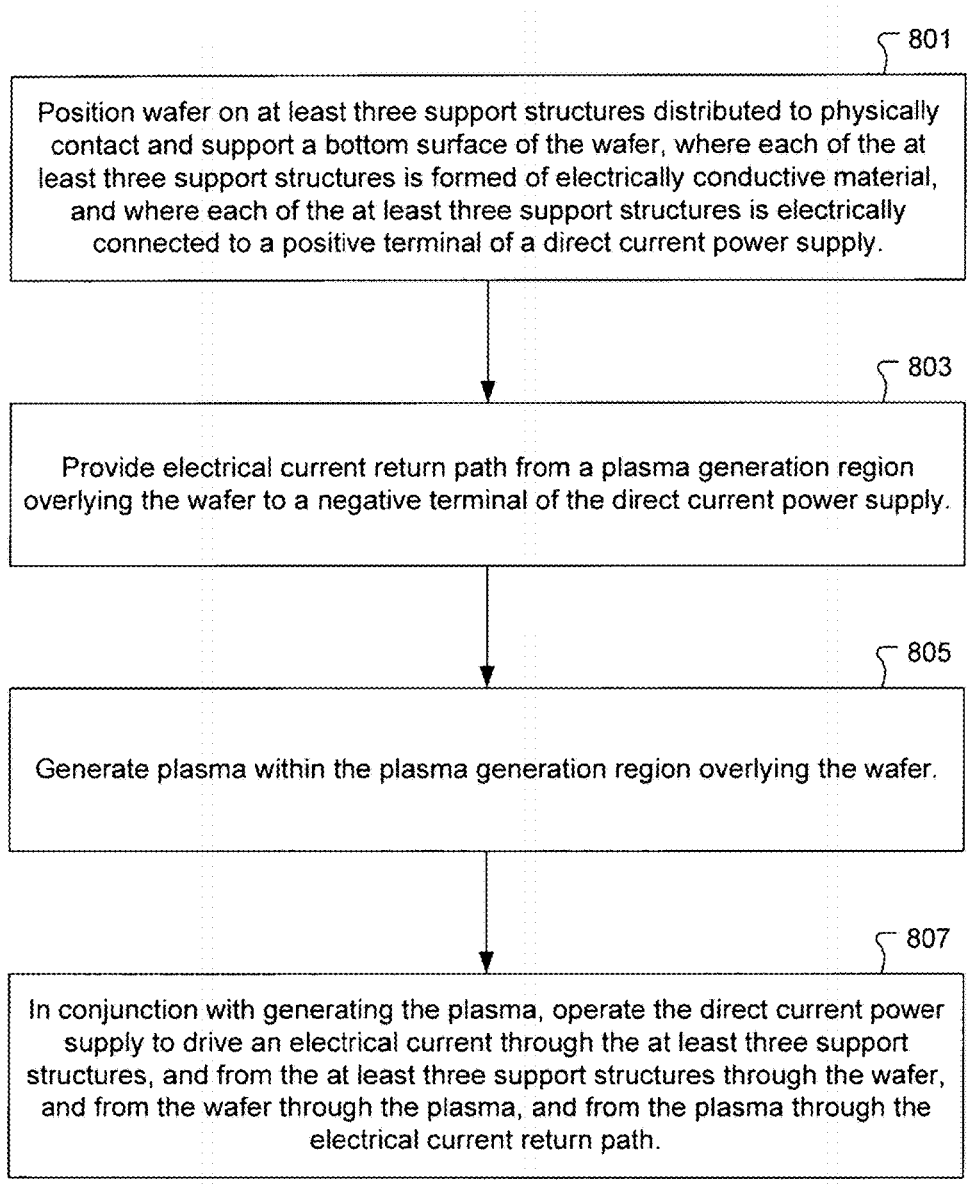
FIG. 8 shows a flowchart of a method for plasma processing of a wafer, in accordance with some embodiments of the present invention.

FIG. 8 shows a flowchart of a method for plasma processing of a wafer, in accordance with some embodiments of the present invention. The method includes an operation 801 for positioning a wafer (101) on at least three support structures (511) distributed to physically contact and support a bottom surface of the wafer (101). Each of the at least three support structures (511) is formed of electrically conductive material. Also, each of the at least three support structures (511) is electrically connected to a positive terminal of a direct current power supply (521).

The method also includes an operation 803 for providing an electrical current return path from a plasma generation region overlying the wafer (101) to a negative terminal of the direct current power supply (521). In some embodiments, such as shown in FIG. 6, by way of example, the electrical current return path is provided from the plasma generation region through an electrode (such as the showerhead electrode 150/150A), and from the electrode (150/150A) to the negative terminal of the direct current power supply (521). In some embodiments, such as shown in FIG. 7, by way of example, the electrical current return path is provided from the plasma generation region through a wall of a chamber (102) within which the plasma generation region is formed, and from the wall of the chamber (102) to the negative terminal of the direct current power supply (521).

The method also includes an operation 805 for generating a plasma (601) within the plasma generation region overlying the wafer (101). In some embodiments, generating the plasma (601) within the plasma generation region in operation 805 includes supplying radiofrequency power to an electrode (such as showerhead electrode 150/150A) overlying the plasma generation region. The method also includes an operation 807 for operating the direct current power supply (521) to drive an electrical current through the at least three support structures (511), and from the at least three support structures (511) through the wafer (101), and from the wafer (101) through the plasma (601), and from the plasma (601) through the electrical current return path to the negative terminal of the direct current power supply (521). Driving of the electrical current in operation 807 is performed in conjunction with generating the plasma (601) in operation 805.

In some embodiments, operation 807 includes operating the direct current power supply (521) to generate an electrical current within a range extending up to about 100 milliAmperes, or within a range extending from about 30 milliAmperes to about 70 milliAmperes. It should be understood, however, that in some embodiments the DC electrical current transmitted from the DC power supply 521 can be different than the above-mentioned ranges and values. In some embodiments, operation 807 includes operating the direct current power supply (521) to generate an electrical voltage within a range extending up to about +30 volts, or within a range extending from about −10 volts to about +50 volts, or within a range extending from about +20 volts to about +40 volts, or within a range extending from about +10 volts to about +30 volts. It should be understood, however, that in some embodiments the voltage applied by the DC power supply 521 can be different than the above-mentioned ranges and values.

Figure 9:
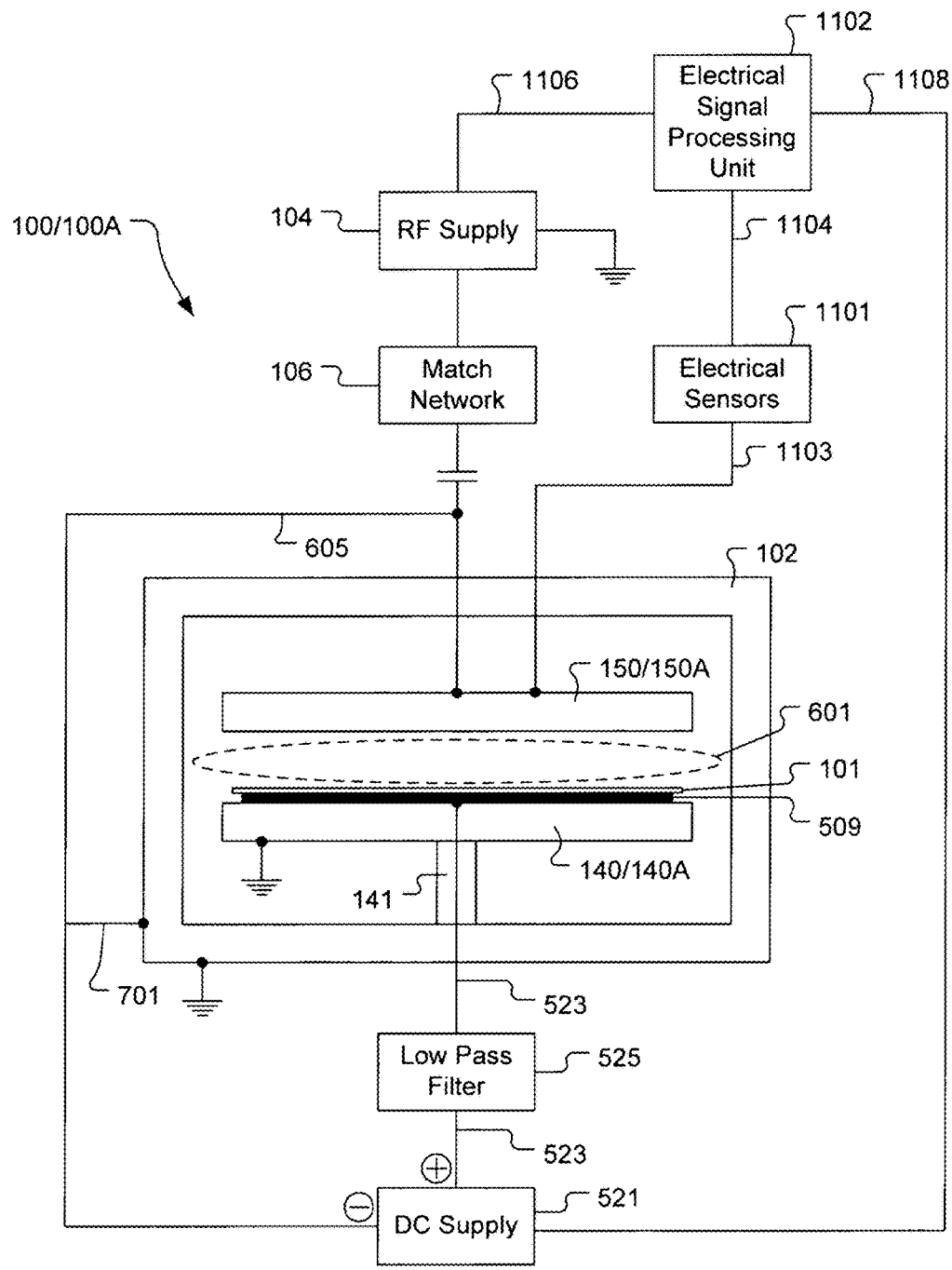
FIG. 9 shows a wafer processing system having electrical sensors electrically connected to the showerhead electrode, in accordance with some embodiments of the present invention.

Methods are also disclosed herein for detecting plasma instabilities, such as plasmoid formation, by measuring and analyzing electrical parameters present on the showerhead electrode 150/150A. FIG. 9 shows the wafer processing system 100/100A having electrical sensors 1101 electrically connected to the showerhead electrode 150/150A, as indicated by electrical connection 1103, in accordance with some embodiments of the present invention. The electrical sensors 1101 are configured to measure RF voltage on the showerhead electrode 150/150A, and/or RF current on the showerhead electrode 150/150A, and/or RF frequency at the showerhead electrode 150/150A, and/or RF impedance at the showerhead electrode 150/150A, and/or RF phase angle at the showerhead electrode 150/150A, and/or RF power at the showerhead electrode 150/150A.

In some embodiments, the wafer processing system 100/100A can include the DC power supply 521, low pass filter 525, and electrical connection 523 as previously described with regard to FIGS. 6 and 7. Also, in some embodiments, the wafer processing system 100/100A can include the electrical connection 605 between the showerhead electrode 150/150A and the negative terminal of the DC power supply 521, and/or the electrical connection 701 between the wall of the chamber 102 and the negative terminal of the DC power supply 521.

Figure 10:
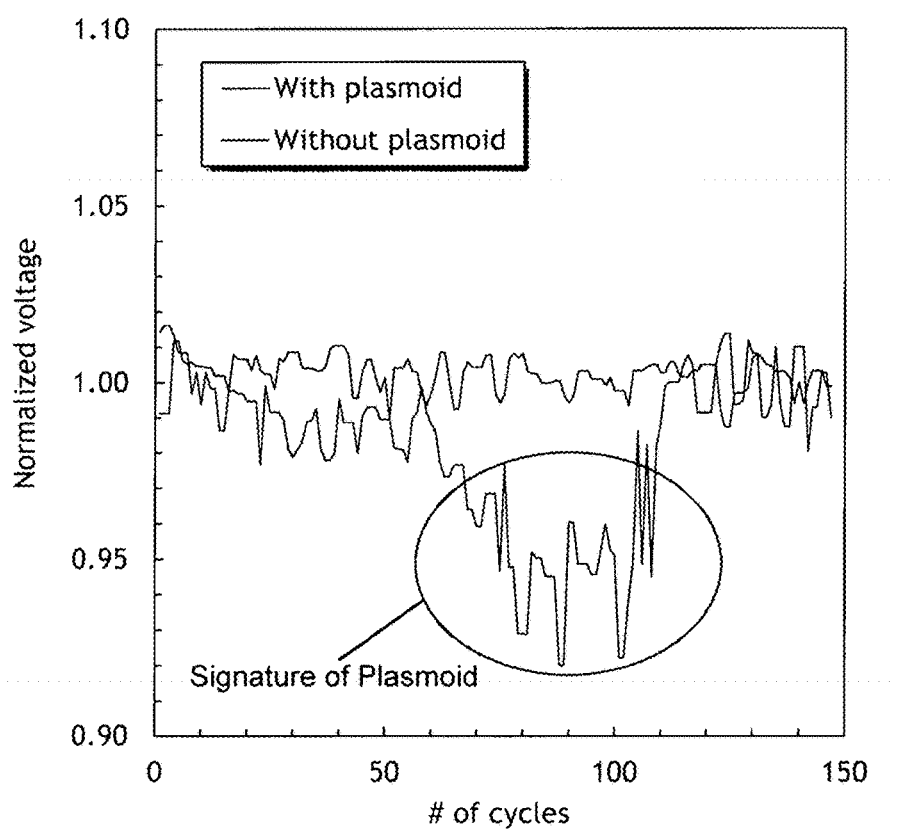
FIG. 10 shows a plot of normalized cycle-averaged RF voltage on the showerhead electrode as a function of a number of process cycles performed, in accordance with some embodiments of the present invention.

In some embodiments, the electrical sensors 1101 are operated to measure RF voltage on the showerhead electrode 150/150A during the plasma processing operation. On-tool tests indicate that cycle-averaged RF voltage and/or instantaneous RF voltage on the showerhead electrode 150/150A drops when a plasmoid is formed. FIG. 10 shows a plot of normalized cycle-averaged RF voltage on the showerhead electrode 150/150A as a function of a number of process cycles performed, in accordance with some embodiments of the present invention. The data shown in FIG. 10 represents the average RF voltage of each process cycle. As shown in FIG. 10, the normalized cycle-averaged RF voltage on the showerhead electrode 150/150A drops when plasmoids are formed. Therefore, by using the electrical sensors 1101 to measure RF voltage on the showerhead electrode 150/150A during the plasma processing operations and by analyzing the measured RF voltage data to detect an indicatory trend/change in cycle-averaged RF voltage and/or instantaneous RF voltage on the showerhead electrode 150/150A, it is possible to determine/detect when plasmoids are formed.

Figure 11:
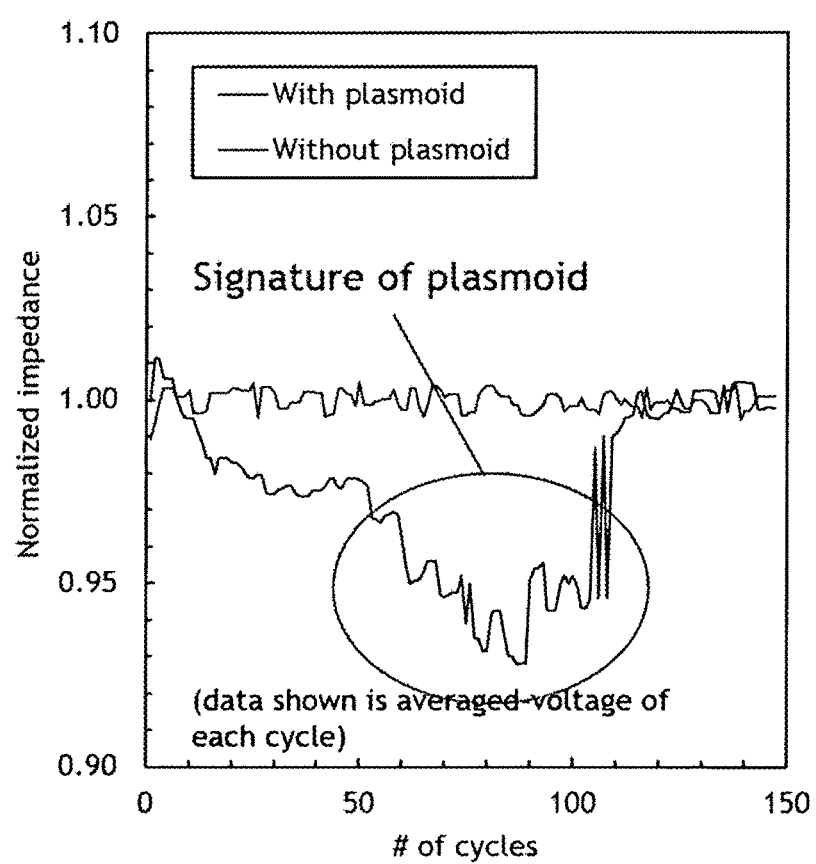
FIG. 11 shows a plot of normalized cycle-averaged RF impedance on the showerhead electrode as a function of a number of process cycles performed, in accordance with some embodiments of the present invention.

FIG. 11 shows a plot of normalized cycle-averaged RF impedance on the showerhead electrode 150/150A as a function of a number of process cycles performed, in accordance with some embodiments of the present invention. The data shown in FIG. 11 represents the average RF impedance of each process cycle. As shown in FIG. 11, the normalized cycle-averaged RF impedance on the showerhead electrode 150/150A drops when plasmoids are formed. Therefore, by using the electrical sensors 1101 to measure RF impedance on the showerhead electrode 150/150A during the plasma processing operations and by analyzing the measured RF impedance data to detect an indicatory trend/change in cycle-averaged RF impedance and/or instantaneous RF impedance on the showerhead electrode 150/150A, it is possible to determine/detect when plasmoids are formed.

Figure 12:
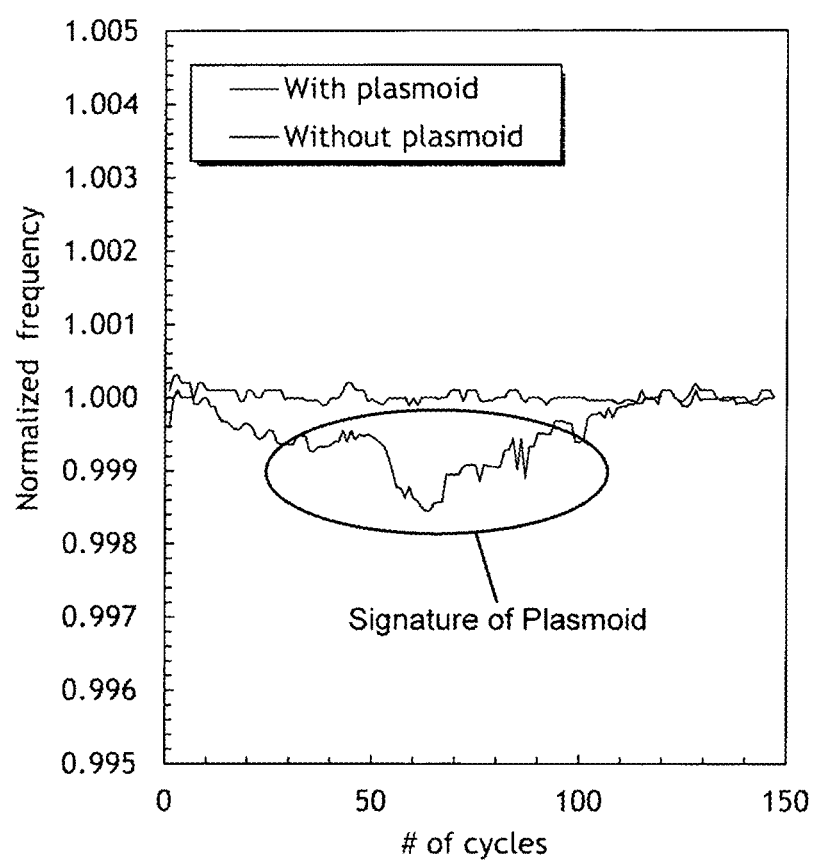
FIG. 12 shows a plot of normalized cycle-averaged RF frequency on the showerhead electrode as a function of a number of process cycles performed, in accordance with some embodiments of the present invention.

FIG. 12 shows a plot of normalized cycle-averaged RF frequency on the showerhead electrode 150/150A as a function of a number of process cycles performed, in accordance with some embodiments of the present invention. The data shown in FIG. 12 represents the average RF frequency of each process cycle. As shown in FIG. 12, the normalized cycle-averaged RF frequency on the showerhead electrode 150/150A drops when plasmoids are formed. Therefore, by using the electrical sensors 1101 to measure RF frequency on the showerhead electrode 150/150A during the plasma processing operations and by analyzing the measured RF frequency data to detect an indicatory trend/change in cycle-averaged RF frequency and/or instantaneous RF frequency on the showerhead electrode 150/150A, it is possible to determine/detect when plasmoids are formed.

In some embodiments, analysis of the measured electrical parameters (RF voltage, RF current, RF impedance, RF phase angle, RF power, RF frequency) on the showerhead electrode 150/150A can be done off-line, i.e., separate from the actual plasma processing of the wafer 101. In some embodiments, analysis of the measured electrical parameters on the showerhead electrode 150/150A can be performed on-line and in real-time. In these embodiments, real-time detection of plasmoid formation can be done by implementing one or more electrical signal processing units 1102 within the wafer processing system 100/100A. The electrical signal processing units 1102 are configured and connected to receive measurement signals from the electrical sensors 1101, as indicated by connection 1104, and analyze the received measurement signals to determine a real-time value for the cycle-averaged RF voltage, and/or instantaneous RF voltage, and/or the cycle-averaged RF current, and/or instantaneous RF current, and/or the cycle-averaged RF impedance, and/or instantaneous RF impedance, and/or cycle-averaged RF phase angle, and/or instantaneous RF phase angle, and/or cycle-averaged RF power, and/or instantaneous RF power, and/or the cycle-averaged RF frequency, and/or instantaneous RF frequency, and determine whether or not an indicatory trend/change of the determined real-time value in view of corresponding previously determined values indicates formation of a plasmoid.

With real-time detection of plasmoid formation provided by way of the electrical signal processing units 1102, a feedback loop can be established between the electrical signal processing units 1102 and the RF power supply 104, as indicated by connection 1106, to provide for tuning of the plasma process to suppress plasmoid formation in real-time. In some embodiments, tuning of the plasma process to suppress plasmoid formation can include modification of characteristics of the applied RF power. The above-mentioned feedback loop can provide for real-time suppression of plasmoid formation. More specifically, because plasmoid formation can be suppressed by lowering the RF power applied to generate and sustain the plasma 601, or by changing another RF generation parameter, detection of plasmoid formation through analysis of data measured using the electrical sensors 1101 can be used to trigger the RF power supply 104 to lower its output RF power, or change another RF generation parameter, until the plasmoid is no longer detected.

Also, in some embodiments, the electrical signal processing units 1102 are configured and connected to transmit control signals to the DC power supply 521, as indicated by connection 1108, to provide for tuning of the plasma process to suppress plasmoid formation in real-time by either directing an increase or a decrease in the DC power supplied to the wafer 101. As discussed herein, the DC bias applied to the backside/underside of the wafer 101 by the DC power supply 521, through the electrical connection 523 and the electrically conductive layer 509, serves as a process tuning parameter which may be adjusted to eliminate plasmoids while having minimal impact on the discharge and the process.

Given the foregoing, it should be understood that a system is disclosed herein for plasma processing of a wafer, such as the wafer processing system 100/100A of FIG. 9. The system 100/100A includes the wafer support apparatus 140/140A configured to support the wafer 101 during a plasma processing operation. The system 100/100A also includes the electrode 150/150A positioned above the wafer support apparatus 140/140A so as to form a plasma generation region between the electrode 150/150A and the wafer support apparatus 140/140A. The system 100/100A also includes the radiofrequency power supply 104 connected to deliver radiofrequency power to the electrode 150/150A. The system 100/100A also includes at least one electrical sensor 1101 connected to the electrode 150/150A and configured to measure one or more of radiofrequency voltage on the electrode 150/150A, radiofrequency current on the electrode 150/150A, radiofrequency phase angle on the electrode 150/150A, radiofrequency power on the electrode 150/150A, radiofrequency signal frequency on the electrode 150/150A, and radiofrequency impedance on the electrode 150/150A.

The system 100/100A also includes the electrical signal processing unit 1102 connected to receive measurement data from the at least one electrical sensor 1101 during the plasma processing operation. The electrical signal processing unit 1102 is configured to determine one or more cycle-averaged and/or instantaneous radiofrequency parameters present on the electrode 150/150A based on the received measurement data from the at least one electrical sensor 1101. The one or more cycle-averaged and/or instantaneous radiofrequency parameters include radiofrequency voltage, radiofrequency current, radiofrequency signal phase angle, radiofrequency power, radiofrequency signal frequency, and radiofrequency impedance.

The electrical signal processing unit 1102 is also configured to determine whether or not an indicatory trend/change exists in one or more of the cycle-averaged and/or instantaneous radiofrequency parameters, where the indicatory trend/change indicates formation of a plasma instability during the plasma processing operation. The electrical signal processing unit 1102 is configured to determine whether or not the indicatory trend/change exists as a function of processing cycle over multiple processing cycles performed during the plasma processing operation. In some embodiments, the indicatory trend/change exists when the cycle-averaged and/or instantaneous value of the radiofrequency parameter as a function of plasma processing cycle changes by a threshold percentage relative to a previous running average of the cycle-averaged and/or instantaneous value of the radiofrequency parameter value.

Figure 13:
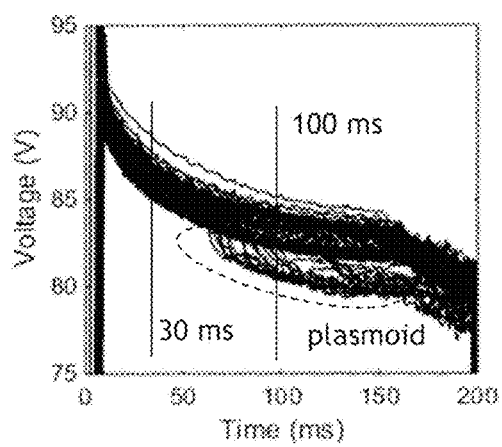
FIG. 13 shows example RF voltage measurement data on the electrode as a function of time during each cycle of a 150 cycle ALD process, in accordance with some embodiments of the present invention.

In various embodiments, determination of whether or not an indicatory trend or change exists in one or more of the cycle-averaged and/or instantaneous radiofrequency parameters can be done in different ways. For example, in some embodiments, determination of whether or not an indicatory trend or change exists in one or more of the cycle-averaged and/or instantaneous radiofrequency parameters can be done by analyzing RF voltage on the electrode 150/150A. FIG. 13 shows example RF voltage measurement data on the electrode 150/150A as a function of time during each cycle of a 150 cycle ALD process, in accordance with some embodiments of the present invention. In some embodiments, RF voltage data such as shown in FIG. 13 can provide a source of data for investigating plasmoid formation. However, it should be understood that other embodiments can measure and analyze other RF parameters, such as RF current, RF phase angle, RF power, RF frequency, and/or RF impedance.

In an example embodiment, variation in the RF voltage on the electrode 150/150A can be analyzed over/between multiple cycles to detect plasmoid formation. One example analytical method for determining whether or not an indicatory trend or change exists in the instantaneous RF voltage parameter data includes determining a target voltage difference value and comparing the determined target voltage difference value to a threshold voltage, where having a target voltage difference value greater than or equal to the threshold voltage indicates the presence of plasmoid formation. The appropriate threshold voltage can be determined through testing. In some embodiments, the target voltage difference value is the difference between voltage measured on the electrode 150/150A at a particular post-ignition time in each of a selected set of cycles and a reference voltage.

Figure 14:
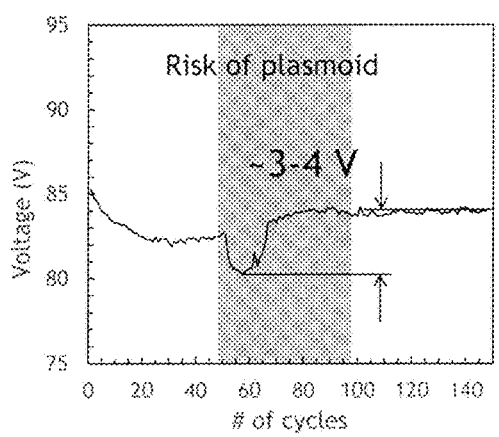
FIG. 14 shows the RF voltage measured on the electrode at 100 ms after plasma ignition for each cycle of the 150 cycle ALD process whose RF voltage data is depicted in FIG. 13, in accordance with some embodiments of the present invention.

For example, FIG. 14 shows the RF voltage measured on the electrode 150/150A at 100 ms after plasma ignition for each cycle of the 150 cycle ALD process whose RF voltage data is depicted in FIG. 13, in accordance with some embodiments of the present invention. In the example of FIG. 14, the particular post-ignition time is 100 ms, and the selected set of cycles includes cycles 50 through 100, and the reference voltage is the voltage on the electrode 150/150A at the post-ignition time of 100 ms in the last cycle of the ALD process, i.e., in cycle 150. It should be understood that in other embodiments the reference voltage can be arbitrarily set and does not necessarily have to correspond to a given measured RF voltage on the electrode 150/150A. In the example of FIG. 14, it can be seen that the target voltage difference value reaches a maximum of about 3-4 V near cycle 60. Therefore, based on FIG. 14, if the threshold voltage were set at about 3 V, then the presently discussed example analytical method would indicate possible plasmoid formation during cycles 55-65.

Figure 15:
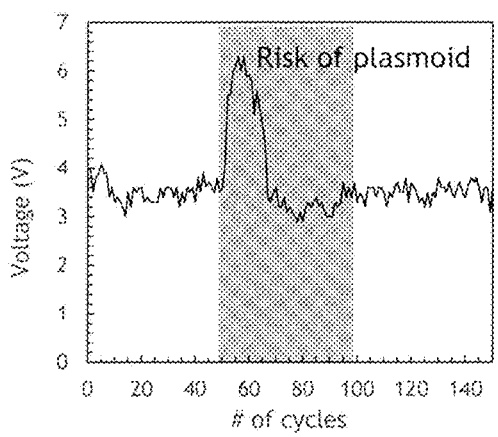
FIG. 15 shows an example of how variation in the RF voltage on the electrode can be analyzed within each cycle to detect plasmoid formation, in accordance with some embodiments of the present invention.

In another example embodiment, variation in the RF voltage on the electrode 150/150A can be analyzed within each cycle to detect plasmoid formation. For example, a target voltage difference value for a given cycle can be defined as the difference between the voltage on the electrode 150/150A at two different times during the given cycle. FIG. 15 shows an example of how variation in the RF voltage on the electrode 150/150A can be analyzed within each cycle to detect plasmoid formation, in accordance with some embodiments of the present invention. In the example of FIG. 15, the target voltage difference value for each cycle is the difference in RF voltage on the electrode 150/150A measured at a post-ignition time within a range of 30 ms to 40 ms and at a post-ignition time within a range of 100 ms to 120 ms. The target voltage difference value for each cycle is compared to a threshold voltage, where having a target voltage difference value greater than or equal to the threshold voltage indicates the presence of plasmoid formation. For example, in FIG. 15, if the threshold voltage was 5 V, then the presently discussed example analytical method would again indicate possible plasmoid formation during cycles 55-65. It should be understood that the particular RV voltage-based analytical methods discussed above for determining whether or not an indicatory trend or change exists in one or more of the cycle-averaged and/or instantaneous radiofrequency parameters are provided by way of example. In other embodiments, different analytical methods can be used to determine whether or not a plasma instability has occurred, and the various analytical methods can be dependent upon the particular RF parameter under analysis.

In some embodiments, the system 100/100A can also include the feedback connection 1106 between the electrical signal processing unit 1102 and the radiofrequency power supply 104. The electrical signal processing unit 1102 is configured to generate and transmit control signals through the feedback connection 1106 to control the radiofrequency power supply 104 based on the determination of whether or not an indicatory trend/change exists in one or more of the cycle-averaged and/or instantaneous radiofrequency parameters.

Also, in some embodiments, the system 100/100A can include the direct current power supply 521 electrically connected to supply electrical current to the wafer support apparatus 140/140A and directly to an underside of the wafer 101 to be supported on the wafer support apparatus 140/140A during the plasma processing operation. Additionally, in some of these embodiments, the system 100/100A can include the feedback connection 1108 between the electrical signal processing unit 1102 and the direct current power supply 521. In these embodiments, the electrical signal processing unit 1102 is configured to generate and transmit control signals through the feedback connection 1108 to control the direct current power supply 521 based on the determination of whether or not an indicatory trend/change exists in one or more of the cycle-averaged and/or instantaneous radiofrequency parameters. It should also be understood that in some embodiments, the system 100/100A includes both the feedback connection 1108 between the electrical signal processing unit 1102 and the direct current power supply 521 and the feedback connection 1106 between the electrical signal processing unit 1102 and the radiofrequency power supply 104, as discussed above.

Figure 16:
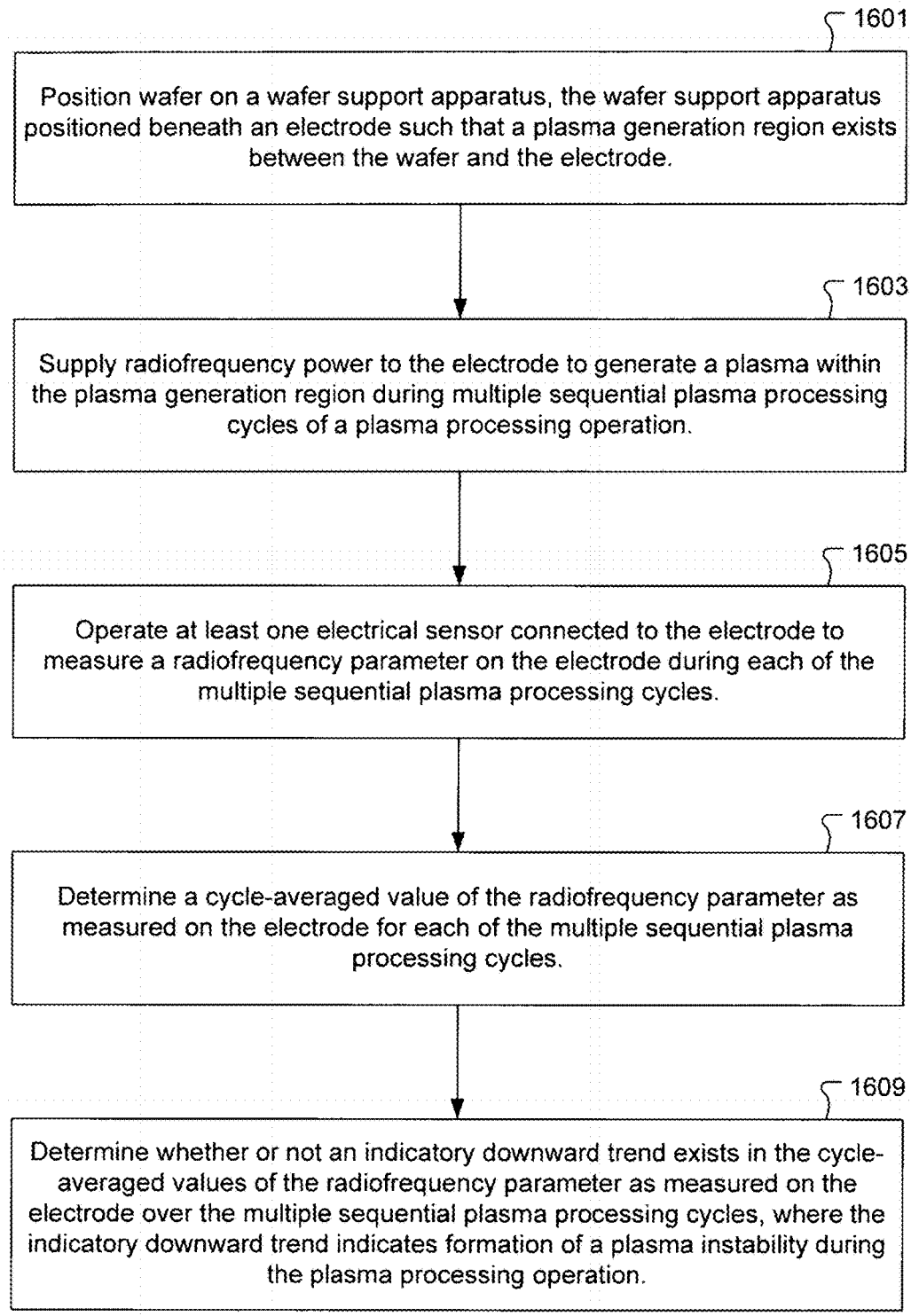
FIG. 16 shows a flowchart of a method for plasma processing of a wafer, in accordance with some embodiments of the present invention.

FIG. 16 shows a flowchart of a method for plasma processing of a wafer, in accordance with some embodiments of the present invention. It should be understood that the method of FIG. 16 can be implemented using the wafer processing system 100/100A of FIG. 9. The method includes an operation 1601 for positioning a wafer (101) on a wafer support apparatus (140/140A). The wafer support apparatus (140/140A) is positioned beneath an electrode (150/150A) such that a plasma generation region exists between the wafer (101) and the electrode (150/150A). The method also includes an operation 1603 for supplying radiofrequency power to the electrode (150/150A) to generate a plasma (601) within the plasma generation region during multiple sequential plasma processing cycles of a plasma processing operation. The method also includes an operation 1605 for operating at least one electrical sensor 1101 connected to the electrode (150/150A) to measure a radiofrequency parameter on the electrode (150/150A) during each of the multiple sequential plasma processing cycles. In various embodiments, the radiofrequency parameter measured on the electrode is one or more of a radiofrequency voltage, a radiofrequency current, a radiofrequency signal frequency, a radiofrequency phase angle, a radiofrequency power, and a radiofrequency impedance.

The method also includes an operation 1607 for determining a cycle-averaged and/or instantaneous value of the radiofrequency parameter as measured on the electrode (150/150A) for each of the multiple sequential plasma processing cycles. And, the method includes an operation 1609 for determining whether or not an indicatory trend or change exists in the cycle-averaged and/or instantaneous values of the radiofrequency parameter as measured on the electrode (150/150A) over the multiple sequential plasma processing cycles, where the indicatory trend or change indicates formation of a plasma instability during the plasma processing operation.

In some embodiments, determining the cycle-averaged and/or instantaneous value of the radiofrequency parameter as measured on the electrode (150/150A) for each of the multiple sequential plasma processing cycles and determining whether or not the indicatory trend or change exists in the cycle-averaged and/or instantaneous values of the radiofrequency parameter as measured on the electrode (150/150A) over the multiple sequential plasma processing cycles are performed after completion of the plasma processing operation. However, in some embodiments, determining the cycle-averaged and/or instantaneous value of the radiofrequency parameter as measured on the electrode (150/150A) for each of the multiple sequential plasma processing cycles and determining whether or not the indicatory trend or change exists in the cycle-averaged and/or instantaneous values of the radiofrequency parameter as measured on the electrode (150/150A) over the multiple sequential plasma processing cycles are performed in real-time, thereby enabling real-time closed-loop feedback control to mitigate formation of any plasma instability during the plasma processing operation.

In some embodiments, the method includes operating an electrical signal processing unit (1102) to receive measurement data from the at least one electrical sensor (1101) while supplying radiofrequency power to the electrode (150/150A) to generate the plasma (601). Also, in these embodiments, the method includes operating the electrical signal processing unit (1102) to determine the cycle-averaged and/or instantaneous value of the radiofrequency parameter as measured on the electrode (150/150A) for each of the multiple sequential plasma processing cycles while supplying radiofrequency power to the electrode (150/150A) to generate the plasma (601). Also, in these embodiments, the method includes operating the electrical signal processing unit (1102) to determine whether or not an indicatory trend or change exists in the cycle-averaged and/or instantaneous values of the radiofrequency parameter as measured on the electrode (150/150A) over the multiple sequential plasma processing cycles while supplying radiofrequency power to the electrode (150/150A) to generate the plasma (601).

In some embodiments, upon determining that the indicatory trend or change does exist in the cycle-averaged and/or instantaneous values of the radiofrequency parameter as measured on the electrode (150/150A) over the multiple sequential plasma processing cycles, the method includes operating the electrical signal processing unit (1102) to generate and transmit control signals to make an adjustment in supplying radiofrequency power to the electrode (150/150A) to mitigate formation of the plasma instability during the plasma processing operation. In some embodiments, the adjustment in supplying radiofrequency power to the electrode (150/150A) causes a reduction in radiofrequency power supplied to the electrode (150/150A). However, it should be understood that in various embodiments, the adjustment in supplying radiofrequency power to the electrode (150/150A) can include any type of adjustment in generation and transmission of radiofrequency signals from the radiofrequency power supply (104) to the electrode (150/150A) as needed to mitigate formation of the plasma instability during the plasma processing operation. Also, in some embodiments, upon determining that the indicatory trend or change does not exist in the cycle-averaged and/or instantaneous values of the radiofrequency parameter as measured on the electrode (150/150A) over the multiple sequential plasma processing cycles, the method includes operating the electrical signal processing unit (1102) to generate and transmit control signals to the radiofrequency power supply (104) to increase an amount of radiofrequency power supplied to the electrode (150/150A).

In some embodiments, the method includes operating a direct current power supply (521) to supply electrical current to the wafer support apparatus (140/140A) and from the wafer support apparatus (140/140A) directly to an underside of the wafer (101) during the plasma processing operation. And, in some embodiments, upon determining that the indicatory trend or change does exist in the cycle-averaged and/or instantaneous values of the radiofrequency parameter as measured on the electrode (150/150A) over the multiple sequential plasma processing cycles, the method includes operating the electrical signal processing unit (1102) to generate and transmit control signals to the direct current power supply (521) to increase an amount of the electrical current supplied by the direct current power supply (521) to the wafer support apparatus (140/140A) and ultimately to the wafer (101) to mitigate formation of the plasma instability during the plasma processing operation.

It should be appreciated that the methods for measuring and analyzing electrical parameters present on the showerhead electrode 150/150A to detect plasmoid formation do not require measurement of film thickness on the wafer 101. The RF characteristics at the showerhead electrode 150/150A as measured by the electrical sensors 1101 and associated data analysis enables identification of when a plasmoid forms and on which wafer the plasmoid forms. The methods for measuring and analyzing electrical parameters of RF voltage, and/or RF current, and/or RF impedance, and/or RF frequency, and/or RF phase angle, and/or RF power on the showerhead electrode 150/150A to detect plasmoid formation saves significant cost and time. For instance, without the methods disclosed herein, the on-wafer thickness profile of the deposited film has to be measured and monitored for each wafer to detect whether or not plasmoid formation occurred during processing and whether or not the plasmoids adversely affected the film thickness profile on the wafer. At a fabrication facility where thousands of wafers are processed on a daily basis, measurement of the on-wafer thickness profile of the deposited film is limited to a statistical sampling and is unable to identify each and every individual wafer that was exposed to plasmoids during processing. In contrast, the methods disclosed herein provide for continuous monitoring and analysis of the electrical parameters (RF voltage, and/or RF current, and/or RF impedance, and/or RF frequency, and/or RF phase angle, and/or RF power) on the showerhead electrode 150/150A during processing of each wafer, e.g., during all ALD cycles of all processed wafers. Therefore, each wafer can be individually analyzed to determine if it was exposed to plasmoids during its plasma processing.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A method for plasma processing of a wafer, comprising:
   positioning a wafer on a wafer support apparatus, the wafer support apparatus positioned beneath an electrode such that a plasma generation region exists between the wafer and the electrode;
   supplying radiofrequency power to the electrode to generate a plasma within the plasma generation region during multiple sequential plasma processing cycles of a plasma processing operation;
   operating at least one electrical sensor connected to the electrode to measure a radiofrequency parameter on the electrode during each of the multiple sequential plasma processing cycles;
   determining a cycle-averaged value of the radiofrequency parameter as measured on the electrode over the multiple sequential plasma processing cycles; and
   determining whether or not an indicatory trend or change exists in the cycle-averaged value of the radiofrequency parameter as measured on the electrode over the multiple sequential plasma processing cycles, wherein the indicatory trend or change indicates formation of a plasma instability during the plasma processing operation.

2. The method for plasma processing of the wafer as recited in claim 1, wherein the radiofrequency parameter measured on the electrode is a radiofrequency voltage.

3. The method for plasma processing of the wafer as recited in claim 1, wherein the radiofrequency parameter measured on the electrode is a radiofrequency current.

4. The method for plasma processing of the wafer as recited in claim 1, wherein the radiofrequency parameter measured on the electrode is a radiofrequency signal frequency.

5. The method for plasma processing of the wafer as recited in claim 1, wherein the radiofrequency parameter measured on the electrode is a radiofrequency impedance.

6. The method for plasma processing of the wafer as recited in claim 1, wherein the radiofrequency parameter measured on the electrode is a radiofrequency phase angle.

7. The method for plasma processing of the wafer as recited in claim 1, wherein the radiofrequency parameter measured on the electrode is a radiofrequency power.

8. The method for plasma processing of the wafer as recited in claim 1, wherein determining the cycle-averaged value of the radiofrequency parameter as measured on the electrode over the multiple sequential plasma processing cycles and determining whether or not the indicatory trend or change exists in the cycle-averaged value of the radiofrequency parameter as measured on the electrode over the multiple sequential plasma processing cycles are performed after completion of the plasma processing operation.

9. The method for plasma processing of the wafer as recited in claim 1, further comprising:
   operating an electrical signal processing unit to receive measurement data from the at least one electrical sensor while supplying radiofrequency power to the electrode to generate the plasma;
   operating the electrical signal processing unit to determine the cycle-averaged value of the radiofrequency parameter as measured on the electrode over the multiple sequential plasma processing cycles while supplying radiofrequency power to the electrode to generate the plasma; and
   operating the electrical signal processing unit to determine whether or not any indicatory trend or change exists in the cycle-averaged value of the radiofrequency parameter as measured on the electrode over the multiple sequential plasma processing cycles while supplying radiofrequency power to the electrode to generate the plasma.

10. The method for plasma processing of the wafer as recited in claim 9, further comprising:
    upon determining that the indicatory trend or change does exist in the cycle-averaged value of the radiofrequency parameter as measured on the electrode over the multiple sequential plasma processing cycles, operating the electrical signal processing unit to generate and transmit control signals to make an adjustment in supplying radiofrequency power to the electrode to mitigate formation of the plasma instability during the plasma processing operation.

11. The method for plasma processing of the wafer as recited in claim 10, wherein the adjustment in supplying radiofrequency power to the electrode causes a reduction in radiofrequency power supplied to the electrode.

12. The method for plasma processing of the wafer as recited in claim 9, further comprising:

upon determining that the indicatory trend or change does not exist in the cycle-averaged value of the radiofrequency parameter as measured on the electrode over the multiple sequential plasma processing cycles, operating the electrical signal processing unit to generate and transmit control signals to increase an amount of radiofrequency power supplied to the electrode.

13. The method for plasma processing of the wafer as recited in claim 9, further comprising:
connecting a direct current power supply to supply electrical current to the wafer support apparatus and from the wafer support apparatus directly to an underside of the wafer during the plasma processing operation; and
upon determining that the indicatory trend or change does exist in the cycle-averaged value of the radiofrequency parameter as measured on the electrode over the multiple sequential plasma processing cycles, operating the electrical signal processing unit to generate and transmit control signals to increase an amount of the electrical current supplied by the direct current power supply to the wafer support apparatus to mitigate formation of the plasma instability during the plasma processing operation.

14. A method for plasma processing of a wafer, comprising:
positioning a wafer on a wafer support apparatus, the wafer support apparatus positioned beneath an electrode such that a plasma generation region exists between the wafer and the electrode;
supplying radiofrequency power to the electrode to generate a plasma within the plasma generation region during multiple sequential plasma processing cycles of a plasma processing operation;
operating at least one electrical sensor connected to the electrode to measure a radiofrequency parameter on the electrode during each of the multiple sequential plasma processing cycles;
determining a instantaneous value of the radiofrequency parameter as measured on the electrode for each of the multiple sequential plasma processing cycles; and
determining whether or not an indicatory trend or change exists in the instantaneous values of the radiofrequency parameter as measured on the electrode over the multiple sequential plasma processing cycles, wherein the indicatory trend or change indicates formation of a plasma instability during the plasma processing operation.

15. The method for plasma processing of the wafer as recited in claim 14, wherein the radiofrequency parameter measured on the electrode is one or more of a radiofrequency voltage, a radiofrequency current, a radiofrequency signal frequency, a radiofrequency impedance, a radiofrequency phase angle, and a radiofrequency power.

16. The method for plasma processing of the wafer as recited in claim 14, wherein determining the instantaneous value of the radiofrequency parameter as measured on the electrode for each of the multiple sequential plasma processing cycles and determining whether or not the indicatory trend or change exists in the instantaneous values of the radiofrequency parameter as measured on the electrode over the multiple sequential plasma processing cycles are performed after completion of the plasma processing operation.

17. The method for plasma processing of the wafer as recited in claim 14, further comprising:
operating an electrical signal processing unit to receive measurement data from the at least one electrical sensor while supplying radiofrequency power to the electrode to generate the plasma;
operating the electrical signal processing unit to determine the instantaneous value of the radiofrequency parameter as measured on the electrode for each of the multiple sequential plasma processing cycles while supplying radiofrequency power to the electrode to generate the plasma; and
operating the electrical signal processing unit to determine whether or not any indicatory trend or change exists in the instantaneous values of the radiofrequency parameter as measured on the electrode over the multiple sequential plasma processing cycles while supplying radiofrequency power to the electrode to generate the plasma.

18. The method for plasma processing of the wafer as recited in claim 17, further comprising:
upon determining that the indicatory trend or change does exist in the instantaneous values of the radiofrequency parameter as measured on the electrode over the multiple sequential plasma processing cycles, operating the electrical signal processing unit to generate and transmit control signals to make an adjustment in supplying radiofrequency power to the electrode to mitigate formation of the plasma instability during the plasma processing operation.

19. The method for plasma processing of the wafer as recited in claim 18, wherein the adjustment in supplying radiofrequency power to the electrode causes a reduction in radiofrequency power supplied to the electrode.

20. The method for plasma processing of the wafer as recited in claim 17, further comprising:
upon determining that the indicatory trend or change does not exist in the instantaneous values of the radiofrequency parameter as measured on the electrode over the multiple sequential plasma processing cycles, operating the electrical signal processing unit to generate and transmit control signals to increase an amount of radiofrequency power supplied to the electrode.

21. The method for plasma processing of the wafer as recited in claim 14, further comprising:
connecting a direct current power supply to supply electrical current to the wafer support apparatus and from the wafer support apparatus directly to an underside of the wafer during the plasma processing operation; and
upon determining that the indicatory trend or change does exist in the instantaneous values of the radiofrequency parameter as measured on the electrode over the multiple sequential plasma processing cycles, operating the electrical signal processing unit to generate and transmit control signals to increase an amount of the electrical current supplied by the direct current power supply to the wafer support apparatus to mitigate formation of the plasma instability during the plasma processing operation.

* * * * *